(12) United States Patent
Basser et al.

(10) Patent No.: US 6,845,342 B1
(45) Date of Patent: Jan. 18, 2005

(54) DETERMINATION OF AN EMPIRICAL STATISTICAL DISTRIBUTION OF THE DIFFUSION TENSOR IN MRI

(75) Inventors: Peter J. Basser, Washington, DC (US); Sinisa Pajevic, Rockville, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 0 days.

(21) Appl. No.: 09/979,013

(22) PCT Filed: May 19, 2000

(86) PCT No.: PCT/US00/14290

§ 371 (c)(1),
(2), (4) Date: Nov. 15, 2001

(87) PCT Pub. No.: WO00/72038

PCT Pub. Date: Nov. 30, 2000

Related U.S. Application Data

(60) Provisional application No. 60/135,427, filed on May 21, 1999.

(51) Int. Cl.[7] .......................................... G01R 33/563
(52) U.S. Cl. ...................... 702/183; 702/189; 382/131
(58) Field of Search ............................. 702/19, 21, 22, 702/27, 28, 32, 40, 49, 174–181, 183, 184; 324/307; 600/410, 411, 416, 436; 382/128, 131; 345/424

(56) References Cited

U.S. PATENT DOCUMENTS

| | | | | |
|---|---|---|---|---|
| 4,922,915 A | * | 5/1990 | Arnold et al. | 382/128 |
| 4,991,092 A | * | 2/1991 | Greensite | 382/131 |
| 5,273,040 A | * | 12/1993 | Apicella et al. | 600/410 |
| 5,539,310 A | * | 7/1996 | Basser et al. | 324/307 |
| 5,692,511 A | * | 12/1997 | Grable | 600/425 |
| 5,859,891 A | * | 1/1999 | Hibbard | 378/62 |
| 5,924,987 A | * | 7/1999 | Meaney et al. | 600/420 |
| 5,969,524 A | * | 10/1999 | Pierpaoli et al. | 324/307 |
| 6,292,683 B1 | * | 9/2001 | Gupta et al. | 600/410 |
| 6,433,547 B2 | * | 8/2002 | Kabasawa et al. | 324/314 |
| 6,441,821 B1 | * | 8/2002 | Nagasawa | 345/426 |

FOREIGN PATENT DOCUMENTS

| | | |
|---|---|---|
| JP | 03-184529 A | 8/1991 |
| JP | 11-000320 A | 1/1999 |

OTHER PUBLICATIONS

Basser, P. J. "A Simplified Method to Measure the Diffusion Tensor from Seven MR Images", 1998. Magnetic Resonance in Medicine, vol. 39, 1998, pp. 928–934.*

Peter J. Basser, "Fiber–Tractography via Diffusion Tensor MRI (DT–MRI)," Sixth Scientific meeting and Exhibition, Sydney, Australia, Apr. 18–24, 1998, vol. 2; pp. 1226.

G.S. Pell et al., "Optimisation of Experimental Parameters for Diffusion Weighted Single–Shot Trace Measurement", Proceedings of the International Society for Magnetic Resonance in Medicine, Fifth Scientific Meeting and Exhibition, Vancouver, B.C., Canada, Apr. 12–18, 1997, vol. 3, p. 1746.

* cited by examiner

*Primary Examiner*—Marc S. Hoff
*Assistant Examiner*—Manuel L. Barbee
(74) *Attorney, Agent, or Firm*—Venable LLP; Michael A. Sartori

(57) ABSTRACT

Diffusion tensor magnetic resonance signals are analyzed. Diffusion weighted, signals are acquired, each signal having a plurality of voxels (10). The diffusion weighted signals are sampled to obtain at least one set of resampled diffusion weighted signals (11). A diffusion tensor for each voxel is determined from each set of the resampled diffusion weighted signals (12). An empirical statistical distribution is determined for a quantity associated with the diffusion tensor from the diffusion tensors determined from the at least one set of the resampled diffusion weighted signals (13).

44 Claims, 10 Drawing Sheets

DETERMINATION OF AN EMPIRICAL STATISTICAL DISTRIBUTION OF THE DIFFUSION TENSOR IN MRI

CROSS REFERENCE TO RELATED APPLICATION

The priority of the following is claimed, and the following is incorporated herein by reference: U.S. Provisional Patent Application No. 60/135,427, filed May 21, 1999.

BACKGROUND OF THE INVENTION

1. Field of the Invention

The invention relates to diffusion tensor magnetic resonance imaging (DT-MRI) and, more particularly, to analyzing DT-MR signals using statistical properties of the diffusion tensor.

2. Background of the Invention

For the convenience of the reader, the following references describing the background of the invention are listed and incorporated herein by reference. Hereinafter, citations to the references are made by referring to the reference numeral.

The first demonstration of the measurement of the diffusion tensor from seven or more diffusion weighted echoes and the presentation of the formulas relating the diffusion weighted signal and the diffusion tensor via the b-matrix are presented in:

(1) P. J. Basser, J. Mattiello, D. LeBihan. Diagonal and off-diagonal components of the self-diffusion tensor: their relation to and estimation from the NMR spin-echo signal. 11th Annual Meeting of the SMRM, Berlin, 1992, p. 1222.

The first demonstration of the measurement of the eigenvalues and eigenvectors of the diffusion tensor and the interpretation as their principal diffusivities and principal directions, as well as measures of diffusion anisotropy and notion of rotational invariance, are presented in:

(2) P. J. Basser, D. LeBihan. Fiber orientation mapping in an anisotropic medium with NMR diffusion spectroscopy. 11th Annual Meeting of the SMRM, Berlin, 1992, p. 1221.

The first article describing the calculation of the diffusion weighting factors needed to calculate the diffusion tensor from the measured diffusion weighted images is:

(3) J. Mattiello, P. J. Basser, D. LeBihan. Analytical expression for the b matrix in NMR diffusion imaging and spectroscopy. *J. Magn. Reson.* A 108, 131–141 (1994).

The first abstract describing the calculation of the diffusion weighting factors needed to calculate the diffusion tensor from the measured diffusion weighted images is:

(4) J. Mattiello, P. J. Basser, D. LeBihan. Analytical expressions for the gradient b-factor in NMR diffusion imaging. 12th Annual Meeting of the SMRM, New York, 1993, p. 1049.

The following abstracts describe diffusion tensor magnetic resonance imaging:

(5) P. J. Basser, J. Mattiello, D. LeBihan. MR imaging of fiber-tract direction and diffusion in anisotropic tissues. 12th Annual Meeting of the SMRM, New York, 1993, p. 1403.

(6) P. J. Basser, J. Mattiello, R. Turner, D. L. Bihan. Diffusion tensor echo-planar imaging of human brain. 12th Annual Meeting of the SMRM, New York, 1993, p. 1404.

The following abstract describes the b-matrix formalism for DT-MRI:

(7) J. Mattiello, P. J. Basser, D. LeBihan. Analytical expressions for the b-matrix in diffusion tensor MR imaging. SMRM Workshop: Functional MRI of the Brain, Arlington, Va., 1993, p. 223.

The first public demonstration of DT-MRI is in:

(8) D. Le Bihan, P. J. Basser, J. Mattiello. C. A. Cuenod, S. Posse, R. Turner. *Assessment of NMR diffusion measurements in biological systems: effects of microdynamics and microstructure*. Syllabus for: SMRM Workshop: Functional MRI of the Brain, Arlington, Va., 1993, p. 19–26.

(9) P. J. Basser, J. Mattiello, R. Turner, D. L. Bihan. Diffusion tensor echo-planar imaging (DTEPI) of human brain. SMRM Workshop: Functional MRI of the Brain, Arlington, Va., 1993, p. 224.

The following describe methodological issues in DT-MRI:

(10) D. Le Bihan, P. J. Basser. *Molecular diffusion and nuclear magnetic resonance*. In: Le Bihan D. ed. Diffusion and Perfusion Magnetic Resonance Imaging, New York: Raven Press, 1995:5–17.

(11) P. J. Basser, D. LeBihan, J. Mattiello. Anisotropic diffusion: MR diffusion tensor imaging. In: LeBihan D. ed. Diffusion and Perfusion Magnetic Resonance Imaging, New York: Raven Press, 1995:140–149.

(12) J. Mattiello, P. J. Basser, D. LeBihan. Analytical calculation of the b matrix in diffusion imaging. In: LeBihan D. ed. Diffusion and Perfusion Magnetic Resonance Imaging, New York: Raven Press, 1995:77–90.

(13) J. Mattiello, P. Basser, D. Le Bihan. The b matrix in diffusion tensor echo-planar imaging. *Magn Reson Med* 37, 2, 292–300 (1997).

The following discusses a demonstration of DT-MRI measurement of anisotropy in a monkey brain:

(14) C. Pierpaoli, J. Mattiello, D. Le Bihan, G. Di Chiro, P. J. Basser. Diffusion tensor imaging of brain white matter anisotropy. 13th Annual Meeting of the SMRM, San Francisco, 1994, p. 1038.

(15) I. Linfante, T. N. Chase, P. J. Basser, C. Pierpaoli. Diffusion tensor brain imaging of MPTP-lesioned monkeys. 1994 Annual Meeting, Society for Neuroscience, Miami, Fla., 1994.

The method to use DT-MRI to calibrate diffusion gradients is presented in:

(16) P. J. Basser. A sensitive method to calibrate magnetic field gradients using the diffusion tensor. Third Meeting of the SMR, Nice, France, 1995, p. 308.

The first article describing the estimation of the diffusion tensor from the diffusion weighed signals or echoes are:

(17) P. J. Basser, J. Mattiello, D. Le Bihan. Estimation of the effective self-diffusion tensor from the NMR spin echo. *J. Magn. Reson.* B 103, 3, 247–254 (1994).

A description of MRI stains useful in tissue characterization is discussed in:

(18) P. Basser, C. Pierpaoli. Elucidation Tissue Structure by Diffusion Tensor MRI. SMR/ESMRMB, Nice, France, 1995, p. 900.

Novel sequences to perform fast and high-resolution DT-NIRI are presented in:

(19) P. Jezzard, C. Pierpaoli. Diffusion mapping using interleaved Spin Echo and STEAM EPI with navigator echo correction. SMR/ESMRMB Joint Meeting, Nice, 1995, p. 903.

A demonstration of DT-MRI of the brain of a human subject is provided in:

(20) C. Pierpaoli, P. Jezzard, P. J. Basser. High-resolution diffusion tensor imaging of the human brain. SMR/ESMRMB Joint Meeting, Nice, 1995, p. 899.

(21) P. Jezzard, C. Pierpaoli. Dual-Echo Navigator Approach to Minimization of Eddy Current and Motion Artifacts in Echo-Planar Diffusion Imaging. Proceedings of the ISMRM, New York, 1996, p. 189.

A method to use DT-MRI in transport and drug delivery applications is presented in:

(22) P. G. McQueen, A. J. Jin, C. Pierpaoli, P. J. Basser. A Finite Element Model of Molecular Diffusion in Brain Incorporating in vivo Diffusion Tensor MRI Data. Proceedings of the ISMRM, New York, 1996, p. 193.

(23) C. Pierpaoli, B. Choi, P. Jezzard, P. J. Basser, G. Di Chiro. Significant changes in brain water diffusivity obsessed under hyperosmolar conditions. SMR/ESMRMB, Nice, France, 1995, p. 31.

DT-MRI in an animal model of cerebral ischemia is presented in:

(24) C. Pierpaoli, C. Baratti, P. Jezzard. Fast Tensor Imaging of Water Diffusion Changes in Gray and White Matter Following Cardiac Arrest in Cats. Proceedings of the ISMRM, New York, 1996, p. 314.

The first demonstration of secondary degeneration of nerve fibers in vivo following stroke is presented in:

(25) C. Pierpaoli, A. Barnett, L. Penix, T. De Graba, P. J. Basser, G. Di Chiro. Identification of Fiber Degeneration and Organized Gliosis in Stroke Patients by Diffusion Tensor MRI. Proceedings of the ISMRM, New York, 1996, p. 563.

Measures of diffusion anisotropy are proposed in:

(26) C. Pierpaoli, P. J. Basser. New Invariant "Lattice" Index Achieves Significant Noise Reduction in Measuring Diffusion Anisotropy. Proceedings of the ISMRM, New York, 1996, p. 1326.

The use of hierarchical statistical estimation model to improve estimate of diffusion tensor is presented in:

(27) P. J. Basser. Testing for and exploiting microstructural symmetry to characterize tissues via diffusion tensor MRI. ISMRM, New York, 1996, p. 1323.

The following is an issued patent for DT-MRI:

(28) P. J. Basser, J. Mattiello, D. LeBihan. Method and System for Measuring the Diffusion Tensor and for Diffusion Tensor Imaging. U.S. Pat. No. 5,539,310, issued Jul. 23, 1996.

The application of DT-MRI to developmental biology is presented in:

(29) C. Barnett, A. Barnett, C. Pierpaoli. Comparative MRI Study of Brain Maturation using T1, T2, and the Diffusion Tensor. 5th ISMRM, Vancouver, 1997, p. 504.

A proof that at least seven diffusion weighted images are required to characterize diffusion anisotropy fully is described in:

(30) P. J. Basser, R. Shrager. Anisotropically-weighted MRI. ISMRM Fifth Scientific Meeting, Vancouver, 1997, p. 226.

(31) R. I. Shrager, P. J. Basser. Anisotropically weighted MRI. *Magn Reson Med* 40, 1, 160–165 (1998).

Perturbation analysis of errors in fiber direction and eigenvalues is presented in:

(32) P. J. Basser. Quantifying Errors in Fiber Direction and Diffusion Tensor Field Maps Resulting from MR Noise. 5th Scientific Meeting of the ISMRM, Vancouver, 1997, p. 1740.

Simplified method for measuring diffusion tensor is presented in:

(33) P. J. Basser, C. Pierpaoli. Analytic Expressions for the Diffusion Tensor Elements. 5th Annual ISMRM, Vancouver, 1997, p. 1738.

(34) P. J. Basser, C. Pierpaoli. A simplified method to measure the diffusion tensor from seven MR images. *Magn Reson Med* 39, 6, 928–934 (1998).

A proposed method for estimating eigenvalues of the diffusion tensor is given in:

(35) P. J. Basser, C. Pierpaoli. Estimating the Principal Diffusivities (Eigenvalues) of the Effective Diffusion Tensor. 5th ISMRM, Vancouver, 1997, p. 1739.

A demonstration of DT-MRI to diagnose Pelizaeus-Merzbacher Disease is given in:

(36) C. Pierpaoli, B. Choi, R. Schiffmann, G. DiChiro. Diffusion Tensor MRI in Pelizaeus-Merzbacher Disease. 5th ISMRM, Vancouver, 1997, p. 664.

Color mapping of fiber direction obtained from DT-MRI data is presented in:

(37) C. Pierpaoli, Oh No! One More Method for Color Mapping of Fiber Tract Direction Using Diffusion MR Imaging Data. 5th ISMRM, Vancouver, 1997, p. 1741.

A scheme for following nerve fiber tracts using DT-MRI is presented in:

(38) P. J. Basser. Fiber-Tractography via Diffusion Tensor MRI (DT-MRJ). 6th ISMRM, 1998, p. 1226.

(39) P. J. Basser. New histological and physiological stains derived from diffusion-tensor MR images. *Ann N Y Acad Sci* 820, 123–138 (1997).

The Monte Carlo method of simulating diffusion tensor MRI data is presented in:

(40) C. Pierpaoli, P. J. Basser. Toward a quantitative assessment of diffusion anisotropy. *Magn Reson Med* 36, 6, 893–906 (1996). Published erratum appears in *Magn Reson Med* 1997 June;37(6):972.

The first paper describing DT-MPI in normal human subjects is presented in:

(41) C. Pierpaoli, P. Jezzard, P. J. Basser, A. Barnett, G. Di Chiro. Diffusion tensor MR imagine of the human brain. *Radiology* 201, 3, 637–648 (1996).

Anisotropy and organization measures of diffusion is presented in:

(42) P. J. Basser, C. Pierpaoli. Microstructural and physiological features of tissues elucidated by quantitative-diffusion-tensor MRI. *J Magn Reson B* 111, 3, 209–219 (1996).

Summary of diffusion tensor MRI "stains" is presented in:

(43) P. J. Basser. Inferring microstructural features and the physiological state of tissues from diffusion-weighted images. *NMR Biomed* 8, 7–8, 333–344 (1995).

The first paper describing DT-MRI is:

(44) P. J. Basser, J. Mattiello, D. LeBihan. MR diffusion tensor spectroscopy and imaging. *Biophys J* 66, 1, 259–267 (1994).

Applying gradient patterns for DT-MRI is discussed in:

(45) T. L. Davis, v. J. Wedeen, R. M. Weisskoff, B. R. Rosen. White matter tract visualization by echo-planar MRI. SMRM Twelfth Annual Meeting, New York, N.Y., 1993, p. 289.

A description of nuclear magnetic resonance (NMR) noise is provided in:

(46) H. Gudbjartsson, S. Patz. The Rician distribution of noisy MRI data [published erratum appears in Magn Reson Med 1996 August;36(2):331]. *Magn Reson Med* 34, 6, 910–914 (1995).

(47) R. M. Henkelman. Measurement of signal intensities in the presence of noise in MR images. *Med. Phys.* 12, 2, 232–233 (1985).

Bootstrap methods are discussed in:

(48) Efron B. "Bootstrap methods: Another look at the jackknife". Ann. Statist., Vol 7, pp 1–26.

Some statistical issues associated with interpreting DT-MRI data are discussed in:

(49) S. Pajevic, and P. J. Basser. Parametric Description of Noise in Diffusion Tensor MRI. 8th Annual Meeting of the ISMRM, Philadelphia, 1787 (1999).

(50) S. Pajevic, and P. J. Basser. Non-parametric Statistical Analysis of Diffusion Tensor MRI Data Using the Bootstrap Method. 8th Annual Meeting of the ISMRM, Philadelphia, 1790 (1999).

Issues about multivariate statistics that are applied to DT-MRI data are discussed in:

(51) T. W. Anderson. An Introduction to Multivariate Statistics: John Wiley & Sons, 1984.

Computer code implementing algorithms for performing statistical tests are discussed in:

(52) W. H. Press, S. A. Teukolsky, W. T. Vetterling, B. P. Flannery. Numerical Recipes in C. Cambridge: Cambridge University Press, 1992.

Other clinical and methodological aspects of DT-MRI are provided below:

(53) P. van Gelderen, M. H. M. d. Vleeschouwer, D. DesPres, J. Pekar, P. C. M. v. Zijl, C. T. W. Moonen. Water Diffusion and Acute Stroke. *Magnetic Resonance in Medicine* 31, 154–163 (1994).

(54) A. M. Ulug, N. Beauchamp, R. N. Bryan, and P. C. M. van Zijl. Absolute Quantitation of Diffusion Constants in Human Stroke. *Stroke* 28, 483–490 (1997).

(55) M. E. Bastin, M. del Grado, I. R. Whittle, and J. M. Wardlaw. An Investigation into the Effect of Dexamethasone on Intracerebral Tumours using MR Diffusion Tensor Imaging, ISMRM, 902 (1999).

(56) P. Mukherjee, M. M. Bahn, R. C. McKinstry, J. S. Shimony, T. S. Cull, E. Akbudak, A. Z. Snyder, and T. E. Conturo. Differences in Water Diffusion between Gray Matter and White Matter in Stroke: Diffusion Tensor MR Imaging Experience in Twelve Patients. ISMRM, Philadelphia, 73 (1999).

(57) M. A. Horsfield, M. Lai, S. L. Webb, G. J. Barker, P. S. Tofts, R. Turner, P. Rudge, and D. H. Miller. Apparent diffusion coefficients in benign and secondary progressive multiple sclerosis by nuclear magnetic resonance. *Magn. Reson. Med.* 36 3, 393–400 (1996).

(58) M. A. Horsfield, H. B. Larsson, D. K. Jones, and A. Gass. Diffusion magnetic resonance imaging in multiple sclerosis. *J Neurol Neurosurg Psychiatry* 64 Suppl 1, S80–84 (1998).

(59) A. O. Nusbaum, C. Y. Tang, M. S. Buchsbaum, L. Shihabuddin, T. C. Wei, and S. W. Atlas. Regional and Global Differences in Cerebral White Matter Diffusion with Alzheimer's Disease. ISMRM, Philadelphia, 956 (1999).

(60) R. Turner, and D. LeBihan. Single shot diffusion imagine at 2.0 Tesla, *J Magn. Reson,* 86, 445–452 (1990).

(61) J. H. Simpson, and H. Y. Carr. Diffusion and nuclear spin relaxation in water. *Physical Review* 111 5, 1201–1202 (1958).

(62) H. Y. Carr, and E. M. Purcell. Effects of diffusion on free precession in nuclear magnetic resonance experiments. *Phys. Rev.* 94 3, 630–638 (1954).

Techniques for determining the mean ADC are discussed in:

(63) G. Liu, P. van Gelderen, C. T. W. Moonen. Single-Shot Diffusion MRI on a Conventional Clinical Instrument. Second SMR Meeting, San Francisco, 1994, p. 1034.

(64) T. E. Conturo, R. C. McKinstry, E. Akbudak, B. H. Robinson. Encoding of anisotropic diffusion with tetrahedral gradients: a general mathematical diffusion formalism and experimental results. *Magn Reson Med* 35, 3, 399–412 (1996).

(65) S. Mori, P. C. van Zijl. Diffusion weighting by the trace of the diffusion tensor within a single scan. *Magn. Resom. Med.* 33, 1, 41–52 (1995).

(66) E. C. Wong, R. W. Cox. Single-shot Imaging with Isotropic Diffusion Weighting. Second Annual Meeting of the SMR, San Francisco, 1994, p. 136.

(67) E. C. Wong, R. W. Cox, A. W. Song. Optimized isotropic diffusion weighting. *Magn Reson Med* 34, 2, 139–143 (1995).

SUMMARY OF THE INVENTION

The effective diffusion tensor of water. D (or $\underline{D}^{eff}$), measured via diffusion tensor magnetic resonance imaging (DT-MRI), is sensitive to tissue structure and its changes in disease, development, aging, etc. However, these D measurements are noisy. Until now, it was not known what probability distribution describes the variability of D, so it was not possible to establish quantitatively whether observed changes or variations in D were statistically significant. The inventors have discovered that in an ideal experiment. D is described by a multivariate Gaussian (or normal) distribution, and have developed quantitative hypothesis tests to determine the statistical significance of observed changes in D (and quantities derived from it), as well as a technique for reporting these data using commonly understood and well established statistical methods. Secondly, because the statistical distribution of D is now known from the invention, it can be determined whether the DT-MRI data is corrupted by systematic artifacts that would cause the distribution to deviate from normality.

This invention makes DT-MR imaging and spectroscopy data more valuable since one can now assess its reliability. Clinically, this new information can be used to diagnose stroke (both acute and chronic) and identify the ischemic "penumbra." The invention can advantageously be used in evaluating soft tissue and muscle structure in orthopedic and cardiology applications. The invention can advantageously be used in neonatal screening and diagnostic applications. Generally, the invention can advantageously be used to segment, cluster, and classify different tissue types based on their diffusion properties. With the invention, this information can advantageously improve studies to screen for the efficacy of newly discovered drugs. The invention can reduce cost of and the time required to perform clinical trials by reducing patient number and identifying unsuitable subjects. The invention can advantageously be used to provide quantitative support for claims of safety and efficacy necessary to obtain Food and Drug Administration (FDA) approval for drugs and medical devices and tissue engineered products. In phenotype/genotype studies in research labs and drug companies these improved imaging parameters obtained with the invention can help determine phenotypic alterations in tissue structure and architecture for a given genotypic modification. This information obtained with the invention can advantageously help materials engineers develop and test the quality of new and processed materials (e.g., polymers, films, gels, plastics, coatings, etc.).

In addition, the invention includes a novel use of the non-parametric Bootstrap method, or variant, for generating estimates of second and higher moments of the diffusion tensor, and functions of it in each voxel. Non-parametric methods, as used in this invention, provide a technique for generating a probability distribution of the diffusion tensor data using a set of empirical diffusion weighted images (e.g., acquired during a single patient scanning session), from which the moments and other features of a probability distribution can be determined. This aspect of the invention enables testing the integrity of experimental diffusion tensor data in each voxel, because it is shown, in the absence of systematic artifacts, that the distribution of the diffusion tensor is statistically normal. Therefore, a statistically significant deviation from normality is evidence of systematic artifacts in the DT-MRI data. Finally, this approach is also helpful in experimental design of DT-MR imaging and spectroscopy experiments.

Once the diffusion tensor is estimated in each voxel, voxels can also be grouped together into regions of interest (ROIs). The distribution of elements of the diffusion tensor within an ROI, or of quantities that are functions of the elements of the diffusion tensor, are also calculated. Statistical hypothesis tests are then applied, for example, in a disease diagnosis application, to determine whether there are significant differences between tissue in different ROIs, or, for example, in a longitudinal study to determine whether there are any differences between tissue within the same ROI observed at different time points.

The invention can be embodied as a method, an apparatus, and as an article of manufacture.

The method of the invention includes analyzing diffusion tensor magnetic resonance signals, comprising the steps of: acquiring a plurality of diffusion weighted signals, each signal having a plurality of voxels; sampling the plurality of diffusion weighted signals to obtain at least one set of resampled diffusion weighted signals; determining a diffusion tensor for each voxel from each set of the resampled diffusion weighted signals; and determining an empirical statistical distribution for a quantity associated with the diffusion tensor from the diffusion tensors determined from the at least one set of the resampled diffusion weighted signals. Thereafter, the empirical statistical distribution can be used to diagnose the subject used to generate the diffusion weighted signals.

Further, the method of the invention includes analyzing diffusion tensor magnetic resonance signals, comprising the steps of: acquiring a plurality of diffusion weighted signals, each signal having a plurality of voxels; identifying at least two regions of interest in the signals, each region of interest comprising at least one voxel; determining a diffusion tensor for each voxel in each region of interest from the diffusion weighted signals; and determining an empirical statistical distribution for a quantity associated with the diffusion tensor from the diffusion tensors for each voxel in each region of interest. Thereafter, the empirical statistical distribution can be used to diagnose the subject used to generate the diffusion weighted signals.

Moreover, the method of the invention includes analyzing diffusion tensor magnetic resonance signals, comprising the steps of: acquiring a plurality of diffusion weighted signals for a first time point, each signal having a plurality of voxels; identifying a region of interest in the diffusion weighted signals for the first time point, the region of interest comprising at least one voxel; determining a diffusion tensor for each voxel in the region of interest for the first time point from the diffusion weighted signals for the first time point; determining an empirical statistical distribution for a quantity associated with the diffusion tensor from the diffusion tensors for each voxel in the region of interest for the first time point; acquiring a plurality of diffusion weighted signals for a second time point, each signal having a plurality of voxels; identifying a region of interest in the diffusion weighted signals for the second time point, the region of interest comprising at least one voxel; determining a diffusion tensor for each voxel in the region of interest for the second time point from the diffusion weighted signals for the second time point; and determining an empirical distribution for a quantity associated with the diffusion tensor from the diffusion tensors for each voxel in the region of interest for the second time point. Thereafter, the empirical statistical distributions can be used to diagnose the subject used to generate the diffusion weighted signals.

Still further, the method of the invention includes analyzing diffusion tensor magnetic resonance signals, comprising the steps of: acquiring a plurality of diffusion weighted signals, each signal having a plurality of voxels; determining a quantity associated with a diffusion tensor for each voxel from the diffusion weighted signals; and determining an empirical statistical distribution for the quantity associated with the diffusion tensor from the quantity associated with the diffusion tensor. Thereafter, the empirical statistical distribution can be used to diagnose the subject used to generate the diffusion weighted signals.

The apparatus for the invention includes a computer programmed with software to operate the computer in accordance with the method of the invention.

The article of manufacture for the invention comprises a computer-readable medium embodying software to control a computer to perform the method of the invention.

A "computer" refers to any apparatus that is capable of accepting a structured input, processing the structured input according to prescribed rules, and producing results of the processing as output. Examples of a computer include: a computer; a general purpose computer; a supercomputer; a mainframe; a super mini-computer; a mini-computer; a workstation; a micro-computer; a server; an interactive television; and a hybrid combination of a computer and an interactive television. A computer also refers to two or more computers connected together via a network for transmitting or receiving information between the computers. An example of such a computer includes a distributed computer system for processing information via computers linked by a network.

A "computer-readable medium" refers to any storage device used for storing data accessible by a computer. Examples of a computer-readable medium include: a magnetic hard disk; a floppy disk; an optical disk, such as a CD-ROM; a magnetic tape; a memory chip; and a carrier wave used to carry computer-readable electronic data, such as those used in transmitting and receiving e-mail or in accessing a network.

A "computer system" refers to a system having a computer, where the computer includes a computer-readable medium embodying software to operate the computer.

A "network" refers to a number of computers and associated devices that are connected by communication facilities. A network involves permanent connections such as cables or temporary connections such as those made through telephone or other communication links. Examples of a network include: an internet, such as the Internet; an intranet; a local area network (LAN); a wide area network (WAN); and a combination of networks, such as an internet and an intranet.

Moreover, the above objects and advantages of the invention are illustrative, and not exhaustive, of those which can be achieved by the invention. Thus, these and other objects and advantages of the invention will be apparent from the description herein, both as embodied herein and as modified in view of any variations which will be apparent to those skilled in the art.

BRIEF DESCRIPTION OF THE DRAWINGS

Embodiments of the invention are explained in greater detail by way of the drawings, where the same reference numerals refer to the same features.

DETAILED DESCRIPTION OF THE INVENTION

Table of Contents

Figure 1:
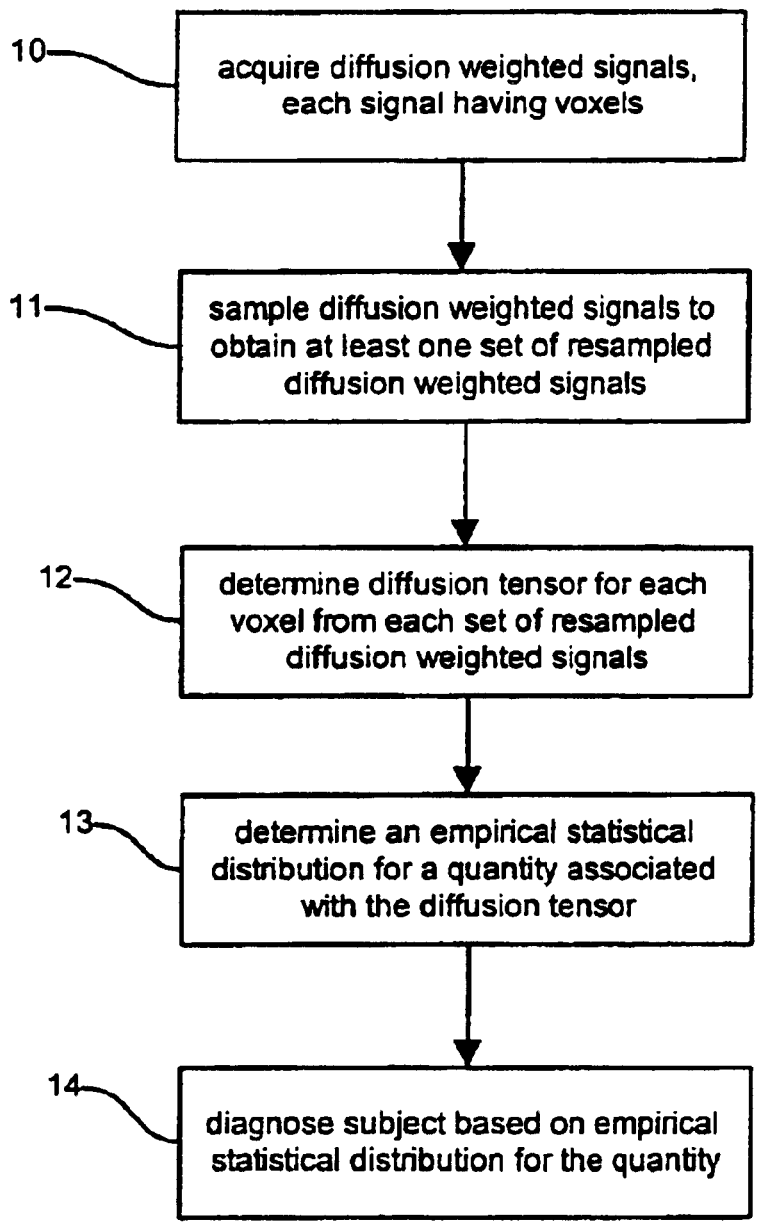
FIG. 1 illustrates a flow diagram for analyzing DT-MR signals.

1. Analyzing DT-MR Signals
2. Parametric Description of Noise in Diffusion Tensor MRI
   2.1 Introduction
   2.2 Methods
   2.3 Results and Discussion
3. Non-Parameteric Statistical Analysis of Diffusion Tensor MRI Data Using the Bootstrap Method
   3.1 Introduction
   3.2 Methods
   3.3 Results and Discussion
4. Bootstrap Analysis of DT-MRI Data
   4.1 Introduction
   4.2 Methods
   4.3 Results and Discussion
5. Quantitative Statistical Tests for Assessing Changes in the Trace of the Diffusion Tensor: Clinical and Biological Implications
   5.1 Introduction
   5.2 Methods
   5.3 Results and Discussion
6. Quantitative Tests for the Variability of the Trace of the Apparent Diffusion Tensor of Water: Clinical and Biological Implications
   6.1 Introduction
   6.2 Methods
   6.3 Results and Discussion 1. Analyzing DT-MR Signals FIG. 1 illustrates a flow diagram for analyzing DT-MR signals. Further details of the flow diagram in FIG. 1 are discussed below in the following sections.

In block 10, diffusion weighted signals are acquired, and each signal contains several voxels. Preferably, each signal contains at least one voxel. The diffusion weighted signals are acquired by a measuring technique. Preferably, the diffusion weighted signals are based on measuring a subject, and the subject is one of a living creature and a non-living object. Examples of a living creature are a human being and an animal. Examples of a non-living object are a phantom, a dead human being, a dead animal, a polymer, a film, a gel, a plastic, and a coating. Alternatively, the diffusion weighted signals are obtained from a simulation using a computer and software. Alternatively, the diffusion weighted signals are stored on and read from a computer-readable medium.

In block 11, the diffusion weighted signals are sampled to obtain at least one set of resampled diffusion weighted signals. Preferably, the resampled diffusion weighted signals are used in a bootstrap simulation, which is discussed further below. Preferably, the diffusion weighted signals are diffusion freighted images.

In block 12, a diffusion tensor is determined for each voxel from each set of resampled diffusion weighted signals. Techniques for determining the diffusion tensor are well known. Preferably, the resampling is performed a plurality of times.

As an option, the diffusion tensor can be determined for each voxel in a subset of the voxels of the resampled diffusion weighted signals. The subsets can be referred to as a region of interest (ROI). The number of voxels in the ROI can be as many as the number of voxels in the resampled diffusion weighted signals and as few as one voxel in the resampled diffusion weighted signals.

As an option, the diffusion tensor can be determined for each voxel in at least one subset of the voxels of the resampled diffusion weighted signals. The subsets can be referred to as a regions of interest (ROIs). The number of voxels in each ROI can be as many as the number of voxels in the resampled diffusion weighted signals and as few as one voxel in the resampled diffusion weighted signals.

In block 13, an empirical statistical distribution is determined for a quantity associated with the diffusion tensor.

Preferably, the empirical statistical distribution is determined using a non-parametric technique, for example, the bootstrap method discussed further below. Other non-parametric techniques, such as an empirical resampling scheme, can also be used. Preferably, the empirical statistical distribution is at least one of the following: a probability density function, a cumulative density function, and a histogram. Preferably, the quantity associated with the diffusion tensor is at least one of the following: an element of the diffusion tensor, a linear combination of the elements of the diffusion tensor, and a function of the diffusion tensor. Preferably, the linear combination of the elements of the diffusion tensor is the Trace of the diffusion tensor. Other empirical distributions and associated quantities can also be determined.

In block 14, a subject is diagnosed based on the empirical statistical distribution of the quantity. Preferably, the subject is diagnosed based on features of the empirical statistical distribution for the quantity. Preferably, the empirical statistical distribution is one of a probability density function and a cumulative density function, and the features of the empirical statistical distribution are the first and higher moments of the empirical statistical distribution.

As an option, the subject can be diagnosed by segmenting, clustering, or classifying a portion of the subject based on features of the empirical statistical distribution of the quantity.

As an option, systematic artifacts in the diffusion weighted signals of the subject can be identified based on features of the empirical statistical distribution for the quantity. Preferably, to identify systematic artifacts, the empirical statistical distribution for the quantity is compared to a parametric statistical distribution for the quantity. For example, the parametric distribution can be a multivariate Gaussian distribution where the quantity is the diffusion tensor. As another example, the parametric distribution can be a univariate Gaussian distribution where the quantity is the Trace of the diffusion tensor.

Figure 2:
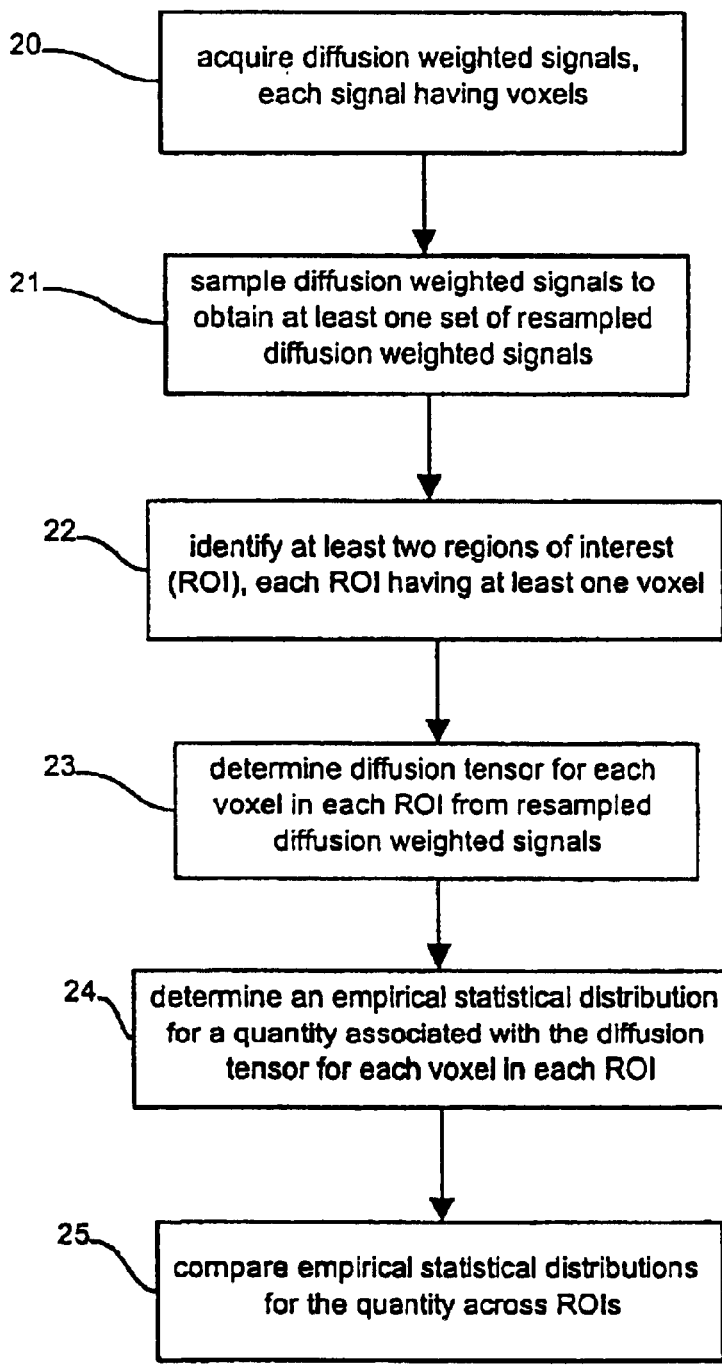
FIG. 2 illustrates a flow diagram for analyzing DT-MR signals for at least two regions of interest.

In block 12 of FIG. 1, a diffusion tensor is determined for each voxel in the diffusion weighted signals, or for each voxel of a subset of voxels in the diffusion weighted signals. This subset can be referred to as a region of interest. As an option, the diffusion tensor can be determined for two or more subsets of voxels in the diffusion weighted signals, where the subsets are referred to as regions of interest. FIG. 2 illustrates this concept as a flow diagram for analyzing DT-MR signals for at least two regions of interest. Further details of the flow diagram in FIG. 2 are discussed below in the following sections.

In block 20, diffusion weighted signals are acquired, and each signal contains voxels. Preferably, each signal contains at least one voxel. Block 20 is similar to block 10.

In block 21, the diffusion weighted signals are sampled to obtain at least one set of resampled diffusion weighted signals. Block 21 is similar to block 11.

In block 22, at least two regions of interest (ROIs) in the resampled diffusion weighted signals are identified, where each ROI comprises at least one voxel.

In block 23, a diffusion tensor is determined for each voxel in each ROI from the resampled diffusion weighted signals. Block 23 is similar to block 12, except the diffusion tensor is determined within at least two ROIs.

In block 24, an empirical statistical distribution is determined for a quantity associated with the diffusion tensor from the diffusion tensors for each voxel in each ROI. Block 24 is similar to block 13, except the empirical statistical distribution is determined for at least two ROIs.

In block 25, the empirical statistical distributions for the quantity are compared across the ROIs to obtain differences in features of the empirical statistical distributions for the quantity between the ROIs. Preferably, the differences in the features of the empirical statistical distributions for the quantity are determined by performing hypothesis tests on the differences in the features of the empirical statistical distributions for the quantity between the regions of interest. In addition, similar analyses as those described for block 14 can be performed for the ROIs in block 25.

Figure 3:
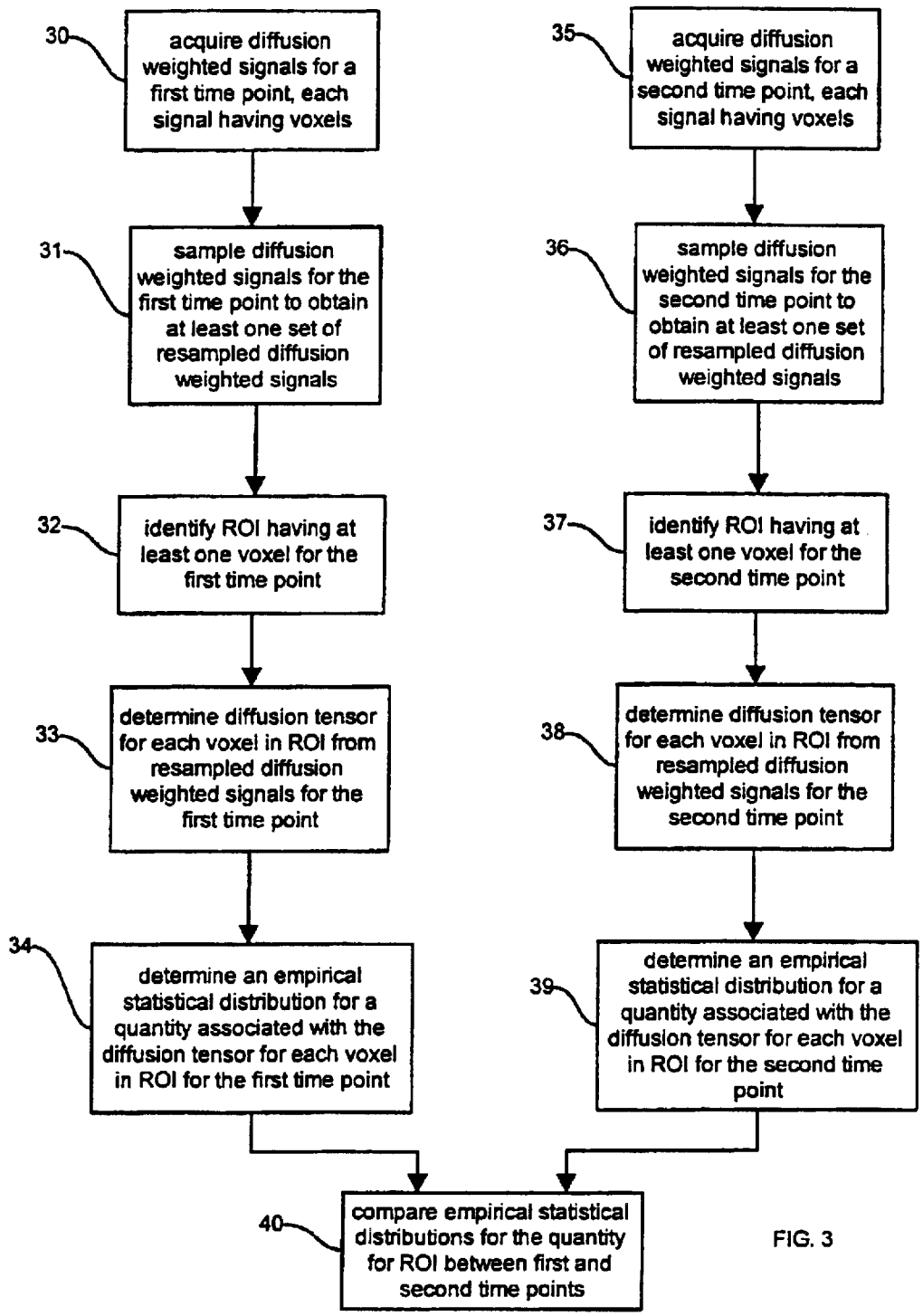
FIG. 3 illustrates a flow diagram for analyzing DT-MR signals for first and second time points.

In FIG. 1, the flow diagram is for a single time point. As an option, the flow diagram of FIG. 1 can be performed for two or more time points for a subject. For example, if the subject is human being, and if the human being has a stroke, the flow diagram of FIG. 1 can be performed shortly after the stroke occurs as a first time point and can be performed a month or so thereafter as a second time point. The results for the first time point and the second time point can thereafter be compared to analyze differences in the human being over time. Additional time points can be obtained for further comparison and analysis. FIG. 3 illustrates this concept as a flow diagram for analyzing DT-MR signals for first and second time points. The technique can be modified to include additional time points. Further details of the flow diagram in FIG. 3 are discussed below in the following sections.

In block 30, diffusion weighted signals for a first time point are acquired, and each signal contains voxels. Preferably, each signal contains at least one voxel. Block 30 is similar to block 10, except for the first time point.

In block 31, the diffusion weighted signals for the first time point are sampled to obtain at least one set of resampled diffusion weighted signals for the first time point. Block 31 is similar to block 11, except for the first time point.

In block 32, an ROI of the resampled diffusion weighted signals for the first time point is identified, where the ROT comprises at least one voxel. The number of voxels in the ROI can be as many as the number of voxels in the resampled diffusion weighted signals and as few as one voxel.

In block 33, a diffusion tensor is determined for each voxel in the ROI from the resampled diffusion weighted signals for the first time point. Block 33 is similar to block 12, except for the first time point.

In block 34, an empirical statistical distribution is determined for a quantity associated with the diffusion tensor for the first time point. Block 34 is similar to block 13, except for the first time point.

In block 35, diffusion weighted signals for a second time point are acquired, and each signal contains at least one voxel. Preferably, each signal contains at least one voxel. Block 35 is similar to block 30, except for the second time point.

In block 36, the diffusion weighted signals for the second time point are sampled to obtain at least one set of resampled diffusion weighted signals for the second time point. Block 36 is similar to block 31, except for the second time point.

In block 37, an ROI of the resampled diffusion weighted signals for the second time point is identified, where the ROI comprises at least one voxel. The number of voxels in the ROI can be as many as the number of voxels in the resampled diffusion weighted signals and as few as one voxel. Preferably, approximately the same ROIs are identified as in blocks 32 and 37.

In block 38, a diffusion tensor is determined for each voxel in the ROI from the resampled diffusion weighted signals for the second time point. Block 38 is similar to block 33, except for the second time point.

In block 39, an empirical statistical distribution is determined for a quantity associated with the diffusion tensor for the second time point. Block 39 is similar to block 34, except for the second time point.

In block 40, features of the empirical statistical distributions are compared for the quantity for the at least one ROI between the first and second time points. By comparing the empirical statistical distributions for the two different time points, changes in time can be monitored and analyzed. In addition, similar analyses as those described for block 14 can be performed for the two time points in block 40.

Figure 4:
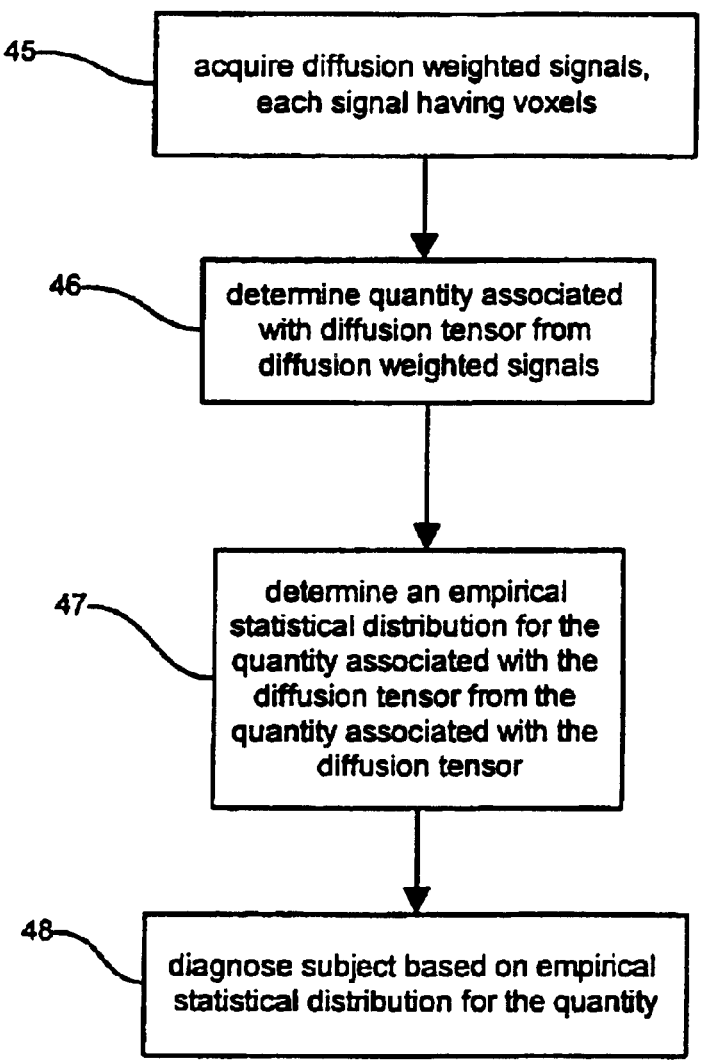
FIG. 4 illustrates a flow diagram for analyzing DT-MR signals without determining the diffusion tensor.

After first determining the diffusion tensor in block 12 of FIG. 1, an empirical statistical distribution of a quantity associated with the diffusion tensor is determined in block 13 of FIG. 1. As an option, for some quantities associated with the diffusion tensor, the diffusion tensor may not need to be determined first, as in block 12. FIG. 4 illustrates this concept as a flow diagram for analyzing DT-MR signals without determining the diffusion tensor. Further details of the flow diagram in FIG. 4 are discussed below in the following sections.

In block 45, diffusion weighted signals are acquired, and each signal contains voxels. Preferably, each signal contains at least one voxel. Block 45 is similar to block 10.

In block 46, a quantity associated with the diffusion tensor of the diffusion weighted signals is determined from the diffusion weighted signals. Preferably, the quantity is an approximation of the Trace of the diffusion tensor of the diffusion weighted signals. As discussed further below, the Trace(D) can be approximated using a total of five, four, two, or one diffusion weighted image(s).

In block 47, an empirical statistical distribution is determined for the quantity associated with the diffusion tensor. Block 47 is similar to block 13.

In block 48, a subject is diagnosed based on the empirical statistical distribution of the quantity. Block 48 is similar to block 14.

As an option, one or more ROIs can be analyzed using the technique of FIG. 4 combined with the technique of FIG. 2.

As an option, two or more time points can be analyzed using the technique of FIG. 4 combined with the technique of FIG. 3.

2. Parametric Description of Noise in DT-MRI

In this section, the ideal parametric model for describing noise in DT-MRI experiments is established as a multivariate normal distribution.

2.1. Introduction

The background noise properties of magnitude MRI images are known to conform to a Ricean distribution (46), (47). In diffusion tensor magnetic resonance imaging (DT-MRI) the components of the diffusion tensor are estimated from noisy diffusion weighted (DW) magnitude images using regression analysis, usually linear regression of the log-linearized DW magnitude signals (17). To date, there have been no attempts to characterize the statistical distribution of diffusion tensor data. This work elucidates noise characteristics of diffusion tensor data assuming that the magnitude images are Ricean distributed.

For signal to noise (S/N) ratios greater than 3, the Ricean distribution is well approximated by a normal distribution with mean $\sqrt{A^2+\sigma^2}$ and variance $\sigma^2$ which is the variance of the signal in each of the quadrature channels. The relationship between the magnitude of the NMR signal and the diffusion tensor components is non-linear. Thus, arriving at an analytical expression for the noise distribution of the diffusion tensor elements is difficult. However, since the regression analysis is usually performed using a large number of independent signals, it is expected that the distribution of the diffusion tensor elements will be Gaussian according to the Central Limit Theorem, even for small S/N ratios.

2.2. Methods

Diffusion tensor data was generated using Monte Carlo simulations by assuming that the noise in the magnitude images is described by a Ricean distribution. Different types of diffusion processes were modeled. Both isotropic and anisotropic diffusion tensors were used, covering typical values obtained in a living human brain. Also, a wide range of S/N values (1–100) and imaging parameters were explored (e.g., the number of images acquired for regression ni was varied from 7 to 70). Real DT-MRI experimental data was used, which was obtained from a healthy female volunteer, to test for normality of diffusion tensor values in different regions of the brain by using the Kolmogorov-Smirnov (KS) test with p=0.01.

2.3. Results and Discussion

Using Monte Carlo simulations of DW-MRI experiments, the six independent components of $\underline{D}^{eff}$ (written as a 6-dimensional vector) are distributed according to a multivariate Gaussian distribution. This holds even in the cases when S/N is less than 2 and only 7 images are used for regression. This distribution is described by two parameters: a 6-dimensional mean vector, $\mu=\{\mu_{xx}, \mu_{yy}, \mu_{zz}, \mu_{xy}, \mu_{xz}, \mu_{yz}\}$; and a 6×6 covariance matrix, $\Sigma$, with non-zero off-diagonal elements. This multivariate distribution for vector $x=(D_{xx}, D_{yy}, D_{zz}, D_{xy}, D_{xz}, D_{yz})$ is written as:

$$p(x|\mu, \Sigma) = \frac{|\Sigma|^{\frac{1}{2}}}{(2\pi)^3} e^{-\frac{1}{2}(x-\mu)^1 \Sigma^{-1}(x-\mu)} \quad (1)$$

If a region of interest (ROI) with homogeneous tensor values can be found, estimation of $\mu$ and $\Sigma$ is straightforward. Estimates of the sample covariance matrix were obtained empirically, using bootstrap analysis or Monte Carlo methods, and analytically, using linear regression models (17). The linear model estimates for log-linearized data are biased for low S/N, particularly the variances of the diagonal elements of the tensor. Also, the prediction of $\Sigma$ degrades for high diffusion attenuation (i.e., large Trace(b)) when the signal approaches the background noise level. Based on experiments for isotropic diffusion of water, the diffusion tensor components follow a Gaussian distribution. When testing normality of patient data, it was found that a majority of voxels conforms to a normal distribution. However, for some, the distribution deviates significantly from normality according to Kolmogorov-Smirnov tests. In this case, the off-diagonal elements are more likely to deviate from a normal distribution than the diagonal ones. Although these could be ordinary Type I errors for the Kolmogorov-Smirnov test, these deviations from normality are attributed to motion and other systematic artifacts which are excluded in the Ricean noise model and are difficult to describe parametrically. This suggests a method to test for such artifacts by testing diffusion tenser data for normality.

Figure 5:
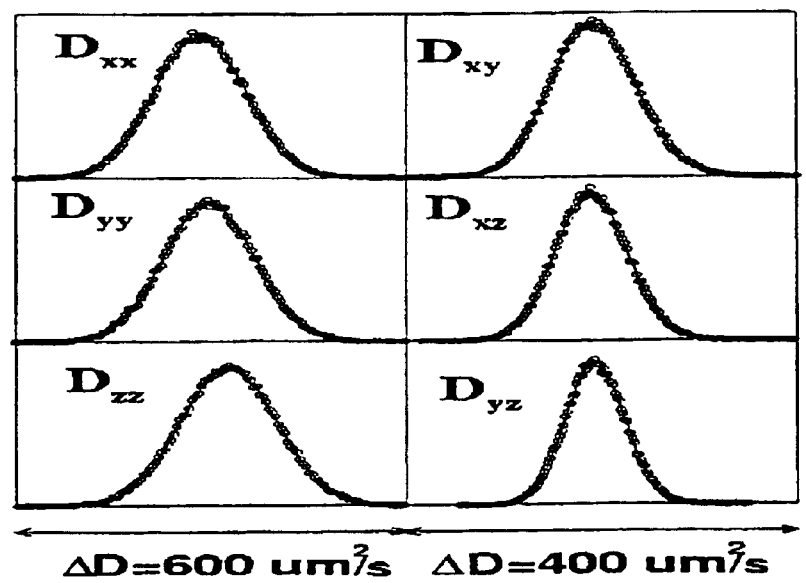
FIG. 5 illustrates probability distributions of the six independent components of the effective diffusion tensor obtained from Monte Carlo simulations.

FIG. 5 illustrates probability distributions of the six independent components of the effective diffusion tensor, namely the anisotropic $\underline{D}^{eff}$ components, obtained from Monte Carlo simulations. The mean vector is $\mu=\{1104, 661, 329, 180, 135, 77\}$ $\mu m^2/s$. The solid line indicates fit to a Gaussian distribution.

3. Non-Parametric Statistical Analysis of Diffusion Tensor MRI Data Using the Bootstrap Method 3.1. Introduction Applications of Diffusion Tensor Magnetic Resonance Imaging (DT-MRF) have grown significantly in recent years. From the measured diffusion tensor, $\underline{D}^{e\!f\!f}$, one can calculate the principal diffusivities and other rotationally invariant measures, such as the Trace of the diffusion tensor, Trace($\underline{D}^{e\!f\!f}$), the relative anisotropy, and other histological stains. To date, only mean values, or first order moments of these quantities, could be estimated in each voxel. Knowing the uncertainties or higher moments of these quantities, and their probability distributions, could help design DT-MRI experiments more efficiently, and improve the ability to analyze DT-MRI data.

In the previous section, a multivariate Gaussian distribution is established as the appropriate parametric statistical model for diffusion tensor data. This is true, however, only in the absence of motion and other systematic artifacts that are difficult to describe parametrically. Hence, as a general approach to analyze DT-MRI data, the invention uses a bootstrap method (48), which is an empirical, non-parametric re-sampling technique to obtain estimates of standard errors, confidence intervals, probability distributions, and other measures of uncertainty. In the same way ordinary samples are used to infer statistical properties of a population, bootstrap samples are used to infer the properties of a sample. The applicability of the bootstrap method to DT-MRI is demonstrated, and the limitations of the bootstrap method are assessed using experimental DT-MRI data and data synthesized using Monte Carlo simulations.

3.2. Methods

The effective diffusion tensor. $\underline{D}^{e\!f\!f}$, is estimated by applying magnetic field, gradients in at least six oblique directions specified by the symmetric matrix, $\underline{b}$. From $\underline{b}$ and the measured $T_2$-weighted signals. $\underline{D}^{e\!f\!f}$ is estimated using weighted multivariate linear regression (17), where A(0), the T2-weighted signal in the absence of diffusion weighting, is also estimated. Monte Carlo simulations of the DT-MRI experiment were implemented (40). Using the Monte Carlo simulation, a set of n noisy signals per oblique direction and also n signals using a zero/small magnetic field gradient were obtained and yielded a total of 7n signals, which are referred to as the original set. Using the original set a bootstrap set is created by drawing n random samples (with replacement) from each of the seven sets to obtain a "new" set of 7n signals. By repeating this step many times. $N_B$, many estimates of each of $\underline{D}^{e\!f\!f}$ are obtained, along with other quantities of interest, e.g., diffusion tensor, Trace($\underline{D}^{e\!f\!f}$), eigenvalues, eigenvectors, etc. The "true" distribution of these quantities can also be predicted using Monte Carlo simulations to validate the bootstrap results.

3.3. Results and Discussion

Estimates of errors and probability distributions were calculated for a variety of quantities of interest. A bootstrap standard error (SE) is the non-parametric maximum likelihood estimate of the true SE. It was found that the bootstrap method is particularly suitable for DT-MRI measurements since reliable estimates of errors can be obtained for a single voxel within inhomogeneous regions. This information cannot be obtained using conventional approaches, since only n samples can be used for estimating the SE (n is commonly less than 5). If one uses voxels within an ROI to estimate errors, the SE is largely exaggerated due to inhomogeneities within the ROI. For example, an ROI consisting of 15 voxels drawn around a particular voxel in gray matter (experimental DT-MRI data with n=4), but very close to the CSF, has a standard deviation for the tensor component $D_{xx}$ of $\sigma$=271 $\mu m^2/s$.

Figure 6:
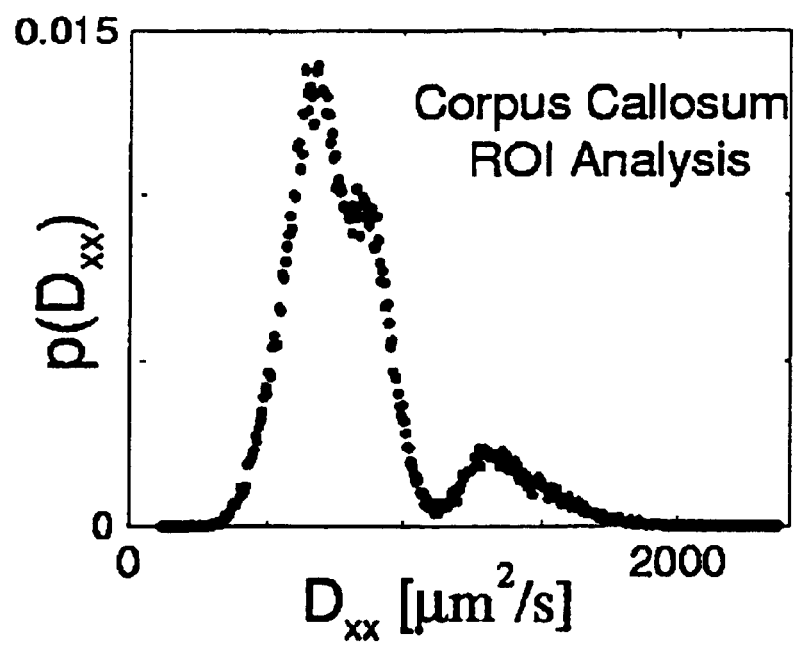
FIG. 6 illustrates a probability distribution of the trace within a region of interest (ROI).

FIG. 6 illustrates a probability distribution of $D_{xx}$ within the ROI obtained using bootstrap analysis which reveals the existence of different modes. The bootstrap estimates of the probability distribution of $D_{xx}$ are for n=4 and $N_B$=5000. The ROI is drawn in gray matter but close to CSF hence partial volume artifacts can be seen.

Figure 7:
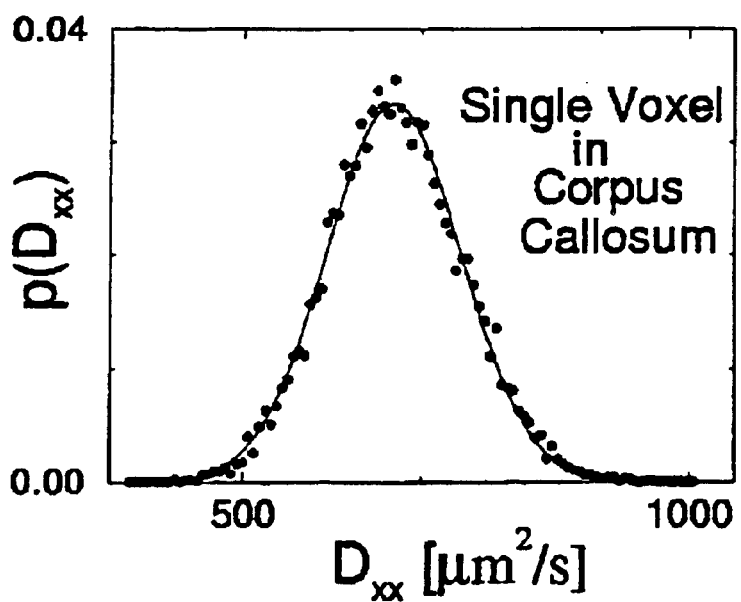
FIG. 7 illustrates a probability distribution obtained within a single voxel.

FIG. 7 illustrates the probability distribution of $D_{xx}$ obtained within a single voxel. The probability distribution of $D_{xx}$ is obtained within a single voxel in gray matter using the bootstrap analysis. The probability distribution fits very well to a Gaussian distribution with $\sigma$=75 $\mu m^2/s$, which is much smaller and more appropriate than the ROI estimate. The validity of the bootstrap method has been confirmed using both real data and Monte Carlo simulations.

The bootstrap method facilitates the use of many new statistical approaches to design and analyze DT-MRIs. The inventors discovered that estimates of the uncertainty and the probability distribution of measured and calculated variables in DT-MRI can be obtained using bootstrap analysis, provided a sufficient number of images are used in the bootstrap resampling scheme. Also, estimates of bias, outliers, and confidence levels can be obtained using the bootstrap method, and hypothesis tests can be performed using the bootstrap method. The primary drawback of the bootstrap method is the extended computation time required, which is proportional to $N_B$. For example, for $N_B$=1000, the bootstrap analysis takes approximately one-half second per voxel on a SPARC ULTRA-60 workstation. On a parallel computer, however, the bootstrap method can be implemented more efficiently. Overall, the bootstrap methodology is an effective tool for statistical analysis of DT-MRI data.

4. Bootstrap Analysis of DT-MRI Data

4.1. Introduction

In DT-MRI, mean values of diffusion tensor components are estimated using statistical methods, such as regression. Using these measured tensor components, one can calculate the principal diffusivities and other rotationally invariant measures, such as the Trace of the diffusion tensor. Trace ($\underline{D}^{e\!f\!f}$), the relative anisotropy, etc. To date, only mean values, or first ($1^{st}$) order moments have been estimated in each voxel. However, knowing the uncertainties or higher moments of these quantities and their probability distributions could help design DT-MRI experiments more efficiently and also improve analysis of DT-MRI data. Obtaining theoretical estimates of the standard error or the probability distribution of a given statistic is complicated since no parametric model is known, and since many of the derived quantities are non-linear functions of the diffusion tensor components.

The invention uses a novel application of the bootstrap method (48), which is an empirical, non-parametric resampling technique to obtain estimates of standard errors, confidence intervals, probability distributions, and other measures of parameter uncertainty. The bootstrap method is applied to DT-MRI, and the limitations of this approach are assessed using experimental DT-MRI data and data synthesized using Monte Carlo simulations.

4.2. Methods

The effective diffusion tensor, $\underline{D}^{e\!f\!f}$, is estimated by applying magnetic field gradients in at least six oblique directions specified by a symmetric matrix $\underline{b}$. From $\underline{b}$ and the measured $T_2$-weighted signals. $\underline{D}^{e\!f\!f}$ is estimated using weighted multivariate linear regression (17), where A(0) is also estimated. Monte Carlo simulations of the DT-MRI experiment were implemented (40). Using the Monte Carlo simulation technique, a set of n noisy signals per oblique direction and also n signals using a zero/small magnetic field gradient were obtained and yielded a total of 7n signals, which are referred to as the original set. Using the original set, a bootstrap set is also created by drawing n random samples (with replacement) from each of the seven signals in the original sets to obtain a "new" set of 7n signals. By repeating this step many times. $N_B$, many estimates of each of $\underline{D}^{\text{eff}}$ were obtained, along with other associated quantities of interest, e.g., diffusion tensor deviatoric, eigenvectors, etc. While computation time scales with the number $N_B$, on a parallel computer the bootstrap method can be implemented more efficiently. The "true" distribution can also be predicted using Monte Carlo simulations to validate the bootstrap results.

4.3. Results and Discussion

Figure 8:
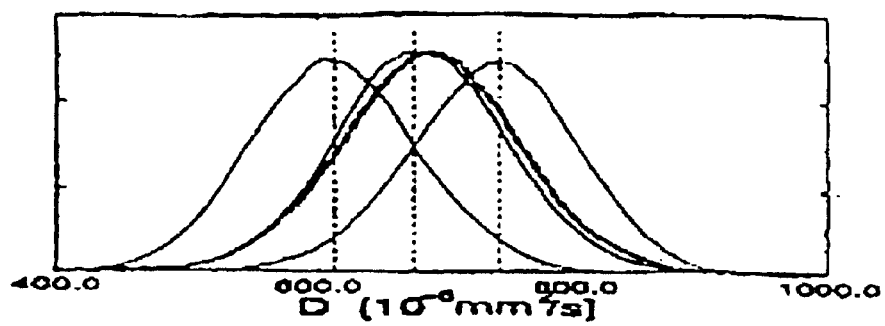
FIG. 8 illustrates a comparison between a "true" probability distribution tensor component and estimates obtained from an original set.

The probability distributions were calculated for a variety of quantities of interest. FIG. 8 illustrates a comparison between a "true" probability distribution of $D_{xx}$ tensor component (thick solid line) and three bootstrap estimates corresponding to three different original sets (thin solid lines), and the estimates obtained from an original set (vertical lines). The bootstrap estimates of the probability distribution of $D_{xx}$ are for n=8 and $N_B$=10,000. The thick dashed line represents the true distribution, and the solid lines represent the bootstrap estimates. The vertical dashed lines are estimates of the original sets used with the bootstrap estimates. Since the probability with which bootstrap samples are drawn is uniform, the estimate of the mean does not change while the standard error (SE) is the nonparametric maximum likelihood estimate of the true SE. With the smaller the number of images n used, the greater are the artifacts that the bootstrap distributions produce.

Figure 9A:
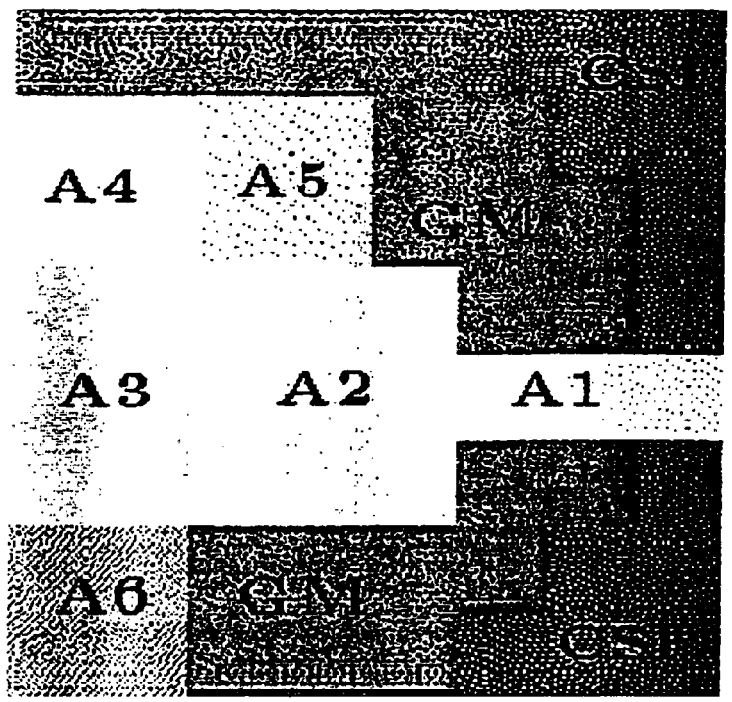
FIG. 9A illustrates data generated using a diffusion phantom.

FIG. 9A illustrates data generated using a diffusion phantom. The computer generated phantom (8×8×1 voxels) has the following regions: CSF (Trace=10.0×10$^3$ mm$^2$/sec. isotropic); Gray Matter—GM (Trace=2.1×10$^{-3}$ mm$^2$/sec. isotropic); and several anisotropic regions with ratios of the largest eigenvalue (principal diffusivity) to the middle one, $r_1$, and middle to smallest one, $r_2$, displayed as $(r_1, r_2)$ coordinate pairs: A1 (8,1); A2 (4,1); A3 (2,1); A4 (1,4); A5 (1,2); A6 (3/2,3/2). The bootstrap samples were obtained for three eigenvectors and calculated angles subtending a cone of uncertainty (32) for each of the three eigenvectors.

Figure 9B:
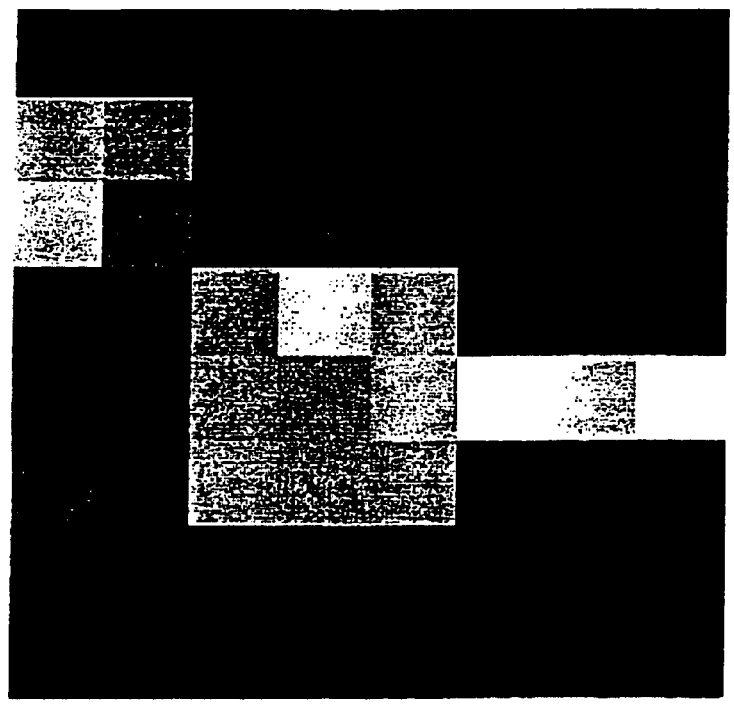
FIG. 9B illustrates an image that is the reciprocal of an angle subtending the smallest cone of uncertainty for three eigenvectors obtained from the bootstrap method.

FIG. 9B illustrates an image that is the reciprocal of the angle subtending the smallest cone of uncertainty for the three eigenvectors obtained from the bootstrap method. As can be seen in FIG. 9B, the intensity of each voxel is inversely proportional to the value of the smallest of the three cone angles.

By comparing FIG. 9B to FIG. 9A, it is seen that a strong relationship exists with the known anisotropy of the diffusion tensor in a given voxel. The results obtained from the simulation were validated using data from a living brain, which show similar behavior, provided there were no systematic artifacts. The bootstrap method may facilitate the use of new statistical approaches to design and analyze DT-MRIs. The estimates of the uncertainty and the probability distributions of measured and calculated variables in DT-MRI can be obtained using bootstrap analysis, provided a sufficient number of images are used in the bootstrap resampling method.

5. Quantitative Statistical Tests for Assessing Changes in the Trace of the Diffusion Tensor: Clinical and Biological Implications A general statistical framework is presented with which to distinguish biologically or clinically significant changes in the Trace of the diffusion tensor. Trace(D), from those due to background noise.

5.1. Introduction

Since the first measurement of Trace(D) (1), where D is the effective diffusion tensor of water, and the first demonstration of Trace MR images (44), it has been widely reported that Trace(D) is uniform in normal brain parenchyma drops substantially in ischemic regions during acute stroke, and increases significantly in chronic stroke. Still, distinguishing changes in Trace(D) caused by alterations in the tissue's physiologic state, its physical properties, or its microstructure, from those caused by background noise, is still problematic.

5.2. Methods

In the previous sections, it is shown that the elements of the diffusion tensor obtained by DT-MRI (44) are distributed according to a multivariate Gaussian probability density function within an ROI which has spatially uniform diffusion properties. This result implies Trace(D) is distributed according to a univariate Gaussian distribution:

$$p(Trace(D)) = \frac{1}{\sqrt{2\pi\sigma_T^2}} \exp\left(-\frac{(Trace(D) - \langle Trace(D)\rangle)^2}{2\sigma_T^2}\right) \quad (2)$$

within the same homogeneous ROI, where <Trace(D)> is the mean, and $\sigma_T^2$ is the variance. Further, $\sigma_T$ includes contributions from variances of $D_{xx}$, $D_{yy}$, and $D_{zz}$ (e.g., Var($D_{xx}$)), and from their covariances (e.g., Cov($D_{xx}$, $D_{yy}$)).

With this distribution, hypotheses can be formulated about the moments of Trace(D) within ROIs, and tested quantitatively (e.g., see (51)) for the first time using the invention. Specifically, the relevant hypotheses, such as whether the Trace(D) is uniform in normal brain parenchyma, whether the Trace(D) drops significantly in ischemic areas, or whether the Trace(D) is elevated in diseased areas of brain parenchyma, can be tested clinically or biologically. To assess the degree of heterogeneity of the Trace(D) in different ROIs, the hypothesis that the variance of the Trace in different ROIs can be tested. Prior to the invention the variance of the Trace has never been examined, and now, with the invention, may provide valuable physiological information. For example, the variance of the Trace(D) can be examined using F-tests adapted for this purpose. Finally, to assess if Trace(D) is normally distributed within an ROI, a Kolmogorov-Smirnov test or one of its variants can be used. These tests indicate whether Trace data is corrupted by systematic artifacts (e.g., by motion).

5.3. Results and Discussion

Monte Carlo simulations of DT-MRI experiments were performed in ROIs containing diffusion tensors, which has diffusion properties corresponding to normal or ischemic gray and white matter (41). Simulations were also performed at different signal-to-noise ratios (SNR). Trace($\underline{b}$) varied from 0 to 900 sec/mm$^2$ in simulations using 4 sets of 6 DWI acquired with diffusion gradients oriented isotropically, along 6 different directions.

Figure 10:
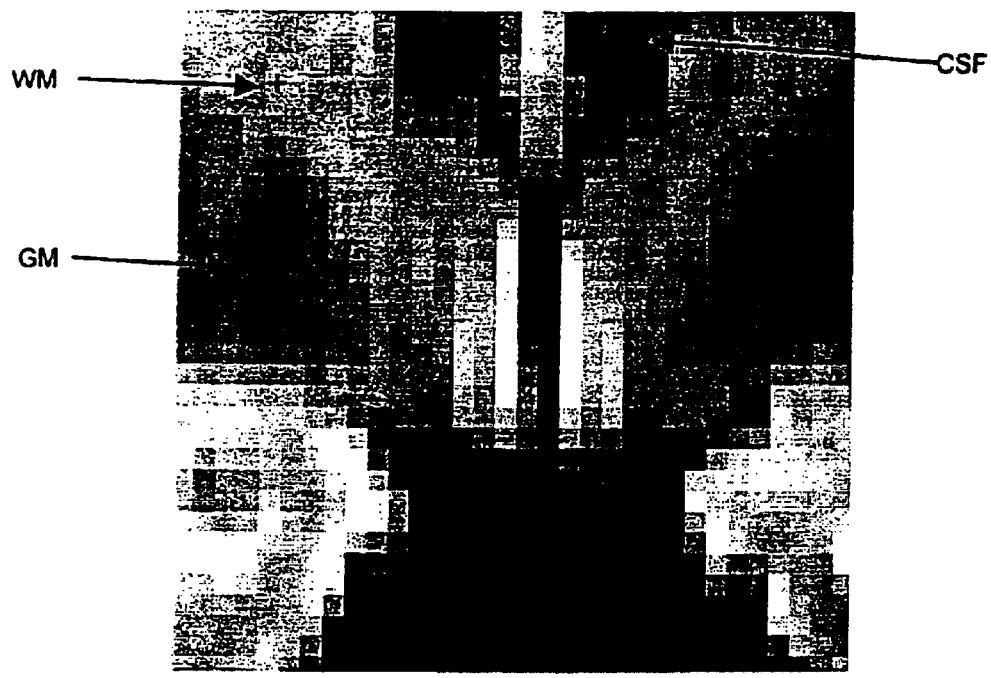
FIG. 10 illustrates selecting individual voxels.

FIG. 10 illustrates selecting individual voxels as regions of interest. Voxels containing gray matter (GM), white matter (WM), and CSF are indicated as being selected. Each region of interest has a single voxel.

Figure 11A:
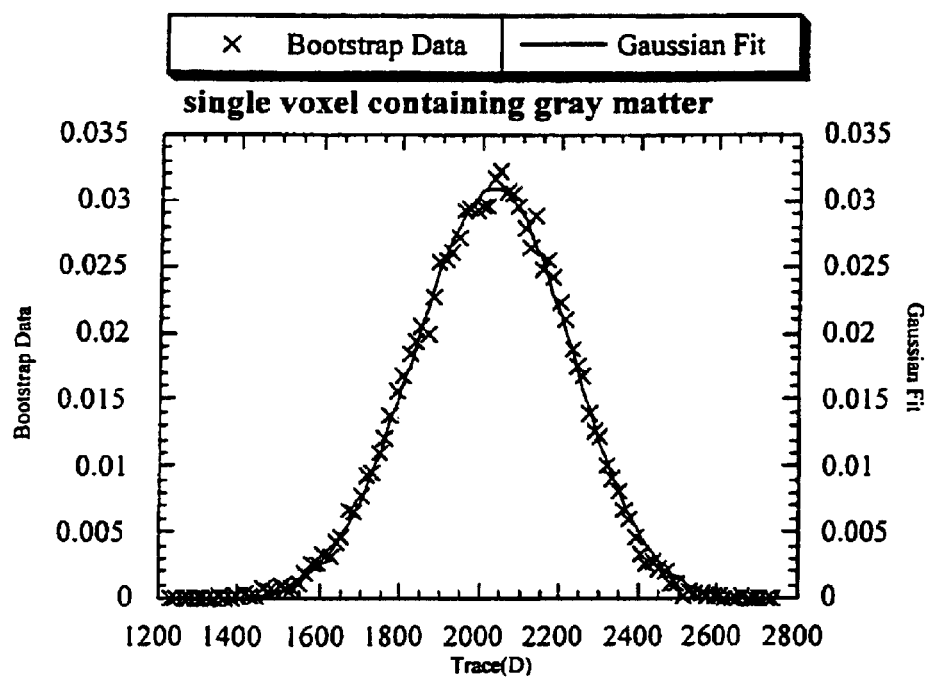
FIG. 11A illustrates empirical bootstrap data obtained from a single voxel in FIG. 10 containing gray matter.
Figure 11B:
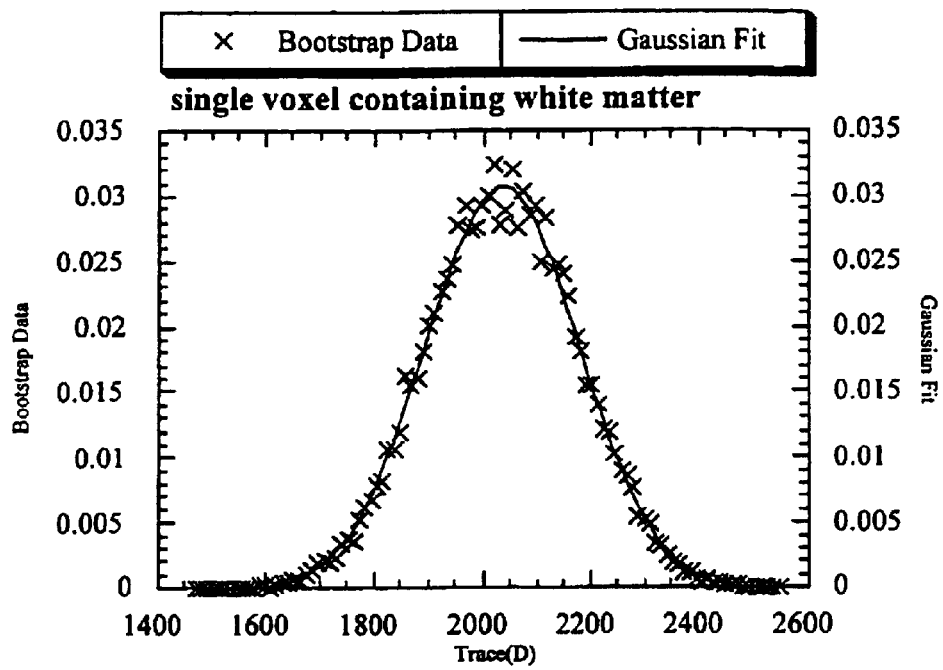
FIG. 11B illustrates empirical bootstrap data obtained from a single voxel in FIG. 10 containing white matter.
Figure 11C:
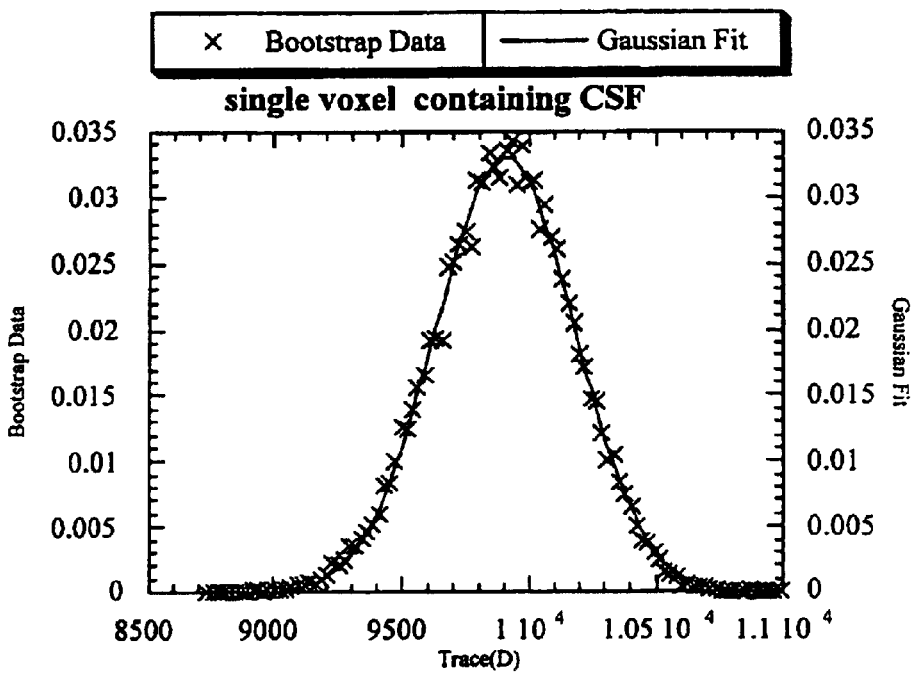
FIG. 11C illustrates empirical bootstrap data obtained from a single voxel in FIG. 10 containing CSF.

Using the bootstrap method, empirical statistical distributions for Trace(D) were determined for the three voxels selected in FIG. 10 based on the diffusion tensors determined for the voxels. In addition, the parametric statistical distributions for Trace(D) were determined for each voxel using the univariate Gaussian distribution. FIGS. 11A–11C illustrate comparing the empirical statistical distributions for Trace(D) with the parametric statistical distributions for Trace(D). Specifically, FIG. 11A illustrates empirical bootstrap data obtained from a single voxel in FIG. 10 containing gray matter, and data in FIG. 11A was also fitted using a Gaussian distribution. FIG. 11B illustrates empirical bootstrap data obtained from a single voxel in FIG. 10 containing white matter, and data in FIG. 11B was also fitted using a Gaussian distribution. FIG. 11C illustrates empirical bootstrap data obtained from a single voxel in FIG. 10 containing CSF, and data in FIG. 11C was also fitted using a Gaussian distribution. As can be seen in FIGS. 11A–11C, the empirical statistical distributions for Trace(D) closely track the parametric statistical distributions for Trace(D), and it can be inferred that almost no artifacts exist in the diffusion weighted images.

Quantitative hypothesis tests can be constructed for differences or changes in Trace(D) between individual voxels either by using non-parametric methods to generate many replicates of a DT-MRI experiment from a single study, or by pooling data from a single study to construct a distribution of D within an ROI. Thus, useful features can be determined about Trace(D) in a single voxel, within an ROI, and between different ROIs. As examples, quantitative hypothesis tests for Trace(D) can be constructed for the following:

Is Trace(D) uniform within an ROI?

Is Trace(D) uniform within normal brain parenchyma?

Is the difference in Trace(D) significant in two ROIs containing brain parenchyma?

Does Trace(D) drop significantly in ischemic ROIs?

Is Trace(D) elevated in diseased areas?

What is the minimum drop in Trace(D) that can be reliably detected at each SNR?

To assess the heterogeneity of Trace(D) in different ROIs, is the variance of the Trace the same in different ROIs?

Figure 12:
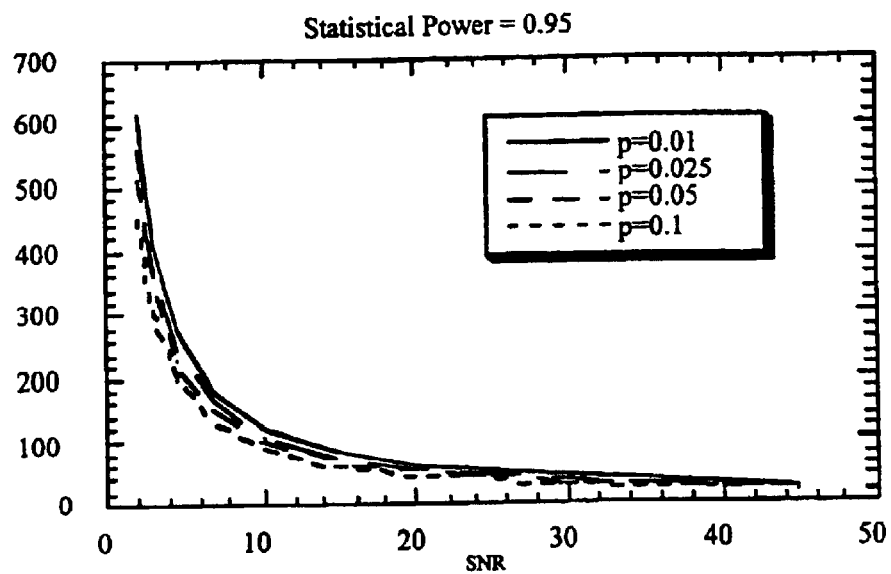
FIG. 12 illustrates an hypothesis test of whether the difference in an ROT-averaged Trace measurement is statistically significant at a fixed statistical power.

FIG. 12 illustrates the hypothesis of whether the difference in an ROI-averaged Trace measurement is statistically significant at a fixed statistical power. Using an analytical expression that implicitly relates the minimum detectable significant difference in Trace(D), $\delta$, to the power of the test, the p-level, the variance or SNR, and the number of voxels comprising the ROI. $\delta$ is plotted against SNR for an ROI containing 50 voxels and a statistical power of 0.95. The different curves in FIG. 12 correspond to different p-levels, and the higher the confidence level desired, the larger $\delta$ is at each SNR. The left axis of FIG. 12 displays the minimum detectable change in Trace(D) ($\mu m^2/sec$). Also, the nearly hyperbolic relationship between $\delta$ and SNR indicates the tradeoff between $\delta$ and SNR. Similar results are obtained for the minimal detectable significant difference in the variance of Trace(D).

Many statistical quantities in MRI and, in particular, DT-MRI are both biased and non-Gaussian distributed. Examples include the sorted eigenvalues of D (40) and their corresponding eigenvectors (64), and measures of diffusion anisotropy (40). Remarkably, Trace(D) is unbiased for SNR above approximately 5 (62) and is shown here to be Gaussian distributed. These two facts make Trace(D) an extremely powerful parameter.

This new methodology of the invention should significantly improve the quality, clinical value, and biological utility of DT-MRI Trace data because the statistical analysis of the invention can now be repeated for any DWI acquisition. The invention provides the first quantitative techniques for testing hypotheses about Trace(D), and its changes in health, development, degeneration, and disease. For the first time. Trace MR imaging experiments can be designed, interpreted, and analyzed (including the detection of statistical artifacts) using rigorous statistical tests rather than ad hoc statistical methods. Confidence intervals can be assigned to observe changes in Trace(D). This approach can find applications to longitudinal, multi-site, drug discovery, and therapeutic efficacy studies, as well as to diagnostic assessment of, for example, stroke, tumors, and other diseases and conditions.

Additionally, the invention can be used to improve the ability to detect subtle changes of diffusion properties, such as required in grading tumors or in identifying the ischemic penumbra. Further, the invention can be used to detect systematic artifacts (e.g., motion) in DWIs on a voxel-by-voxel basis. Finally, this statistical methodology can also be applied to segmenting tissues by their diffusion properties. This framework can also be extended to treat variability of other DT-MRI "stains."

6. Quantitative Tests for the Variability, of the Trace of the Apparent Diffusion Tensor of Water: Clinical and Biological Implications In the previous sections, the Trace of an effective diffusion tensor. Trace(D) measured using DT-MRI is described by a univariate Gaussian distribution whose mean and variance can be estimated directly from DT-MRI data. Quantitative statistical hypotheses test can be designed to discriminate between biologically meaningful changes in Trace(D) (e.g., those occurring in health, development degeneration, and disease) and MR background noise present in all diffusion weighted images. Such tests include determining for any particular signal-to-noise ratio (SNR), the minimum detectable change in Trace(D), whether Trace(D) is uniform in normal brain parenchyma, or whether there is a significant difference between Trace(D) in one brain region and another. Statistically significant differences in Trace(D) data between different tissue regions can be assessed in both longitudinal and multi-site studies. With the invention, the significance of differences in the variance of Trace(D) can be measured between different voxels, different ROIs, and different subjects. Non-parametric (e.g., bootstrap) methods can be used to determine second and higher moments of the distribution of Trace(D) within each voxel. The departure from normality of the distribution of Trace(D) can be used as a sensitive measure of systematic artifacts, for example, caused by subject motion, in diffusion weighted image (DWI) acquisition. Finally, knowing the distribution of Trace(D) permits the use of statistically based image segmentation schemes, such as k-means, for distinguishing between different tissues compartments on the basis of their diffusion properties.

6.1. Introduction

Following the development of DT-MRI (44), it was reported that one of the DT-MRI imaging parameters. Trace (D), the Trace of the diffusion tensor, is spatially uniform within normal living brain parenchyma in cats (53), dogs, macaques(40), and humans (54), (41), and remarkably, has nearly the same value in these species (55). These results are surprising, particularly when one considers the great disparity between gray and white matter anatomy and histology, and the striking differences in brain architecture among these different species. If borne out, however, these results could have important consequences in comparative physiology, as well in early screening and diagnosis of disease, as described below.

Next, the question as to whether these findings are quantitative is addressed. First. MRI-based measurements of Trace(D) are always subject to background noise (40), so even in a homogeneous medium, measurements of Trace(D) still show intrinsic variability from voxel to voxel. Thus, to test the claim of uniformity of Trace(D) quantitatively, this statement must be recast as a statistical hypothesis that the values of Trace(D) in all voxels within normal parenchyma arise from the same statistical distribution. This section addresses the correct form of this distribution and how the hypothesis specifically is written and tested using DT-MRI data.

In acute stroke, the decrease of Trace(D) in ischemic areas has been reported to be as large as 50% (54); in chronic stroke, the increase can be of the same magnitude (54). In many other clinical conditions, the concomitant changes in tissue microstructure, architecture, or physical properties may be small. For example in some conditions, changes in Trace(D) could be difficult to distinguish from signal variations due to background radio frequency (RF) noise. Examples include: identifying and grading tumors (55); measuring small differences in mean diffusivity between white and gray matter in acute stroke (56); identifying MS lesions (57), (58); and following diffuse changes in neuro-degenerative disorders such as Pelizaeus-Merzbacher disease (36). Wallerian degeneration (25), and Parkinson's and Atzheimer's diseases (59). If the spatial uniformity of Trace (D) in a normal brain can be established quantitatively, a significant deviation from Trace(D) could be a useful and sensitive clinical marker for abnormal development or disease, and may also advance methods for their early detection or screening.

Once the level of the minimal clinically significant increase or decrease in Trace(D) is established, the new statistical testing framework can be used in reverse to design MRI scanning protocols that are optimal (e.g., that require the fewest DWIs, take the shortest time, etc.).

More generally, despite the usefulness of Trace(D) in clinical diagnosis, there is presently no quantitatively rigorous methodology available to compare its values in different voxels or regions of interest (ROI) for the same subject during a single scan (e.g., to compare normal and abnormal tissue), to compare its values in the same ROI of the same subject scanned at different time points (e.g., in a longitudinal study), or to compare its values among ROIs in different subjects (e.g., in a multi-center study). To date, only ad hoc statistical tests have been employed for this purpose, because the distribution of Trace(D) within each voxel was unknown, and thus parametrically based statistical tests for Trace(D) could be not be applied meaningfully.

Finally, diffusion weighted images (DWIs) can be contaminated by systematic artifacts, for example, subject motion, eddy currents, susceptibility differences, etc. (60). To date, there has been no satisfying way to test and assess the severity of such artifacts in DWIs. This section further provides a prescription for detecting systematic artifacts in each voxel of a DWI by assessing the departure of the distribution of Trace(D) from its known distribution.

6.2. Methods

In the previous sections, it has been shown that the elements of the diffusion tensor obtained by DT-MRI are distributed according to a multivariate Gaussian probability density function within an ROI having spatially uniform diffusion properties. When D is written as a six dimensional vector, $\tilde{D}=(D_{xx}, D_{yy}, D_{zz}, D_{xy}, D_{xz}, D_{yz})^T$, this distribution can be written as:

$$p(\tilde{D}) = \frac{1}{\sqrt{(2\pi)^b|\Sigma|}} \exp\left(-\frac{1}{2}(\tilde{D}-M)^T \Sigma^{-1}(\tilde{D}-M)\right) \quad (3)$$

where $M=(\mu_{xx}, \mu_{yy}, \mu_{zz}, \mu_{xy}, \mu_{xz}, \mu_{yz})^T$ is the six dimensional mean vector, and $\Sigma$ is the 6×6 covariance matrix, where the off-diagonal elements may be negative:

$$\Sigma = \begin{pmatrix} \sigma^2_{xxxx} & \sigma^2_{xxyy} & \sigma^2_{xxzz} & \sigma^2_{xxxy} & \sigma^2_{xxxz} & \sigma^2_{xxyz} \\ \sigma^2_{xxyy} & \sigma^2_{yyyy} & \sigma^2_{yyzz} & \sigma^2_{xyyy} & \sigma^2_{xzyy} & \sigma^2_{yyyz} \\ \sigma^2_{xxzz} & \sigma^2_{yyzz} & \sigma^2_{zzzz} & \sigma^2_{xyzz} & \sigma^2_{xzzz} & \sigma^2_{yzzz} \\ \sigma^2_{xzyy} & \sigma^2_{xxyy} & \sigma^2_{xxzz} & \sigma^2_{xyxy} & \sigma^2_{xyzz} & \sigma^2_{xyyz} \\ \sigma^2_{xxxz} & \sigma^2_{xzyy} & \sigma^2_{xzzz} & \sigma^2_{xyxz} & \sigma^2_{xzxz} & \sigma^2_{xzyz} \\ \sigma^2_{xxyz} & \sigma^2_{yyyz} & \sigma^2_{xzzz} & \sigma^2_{xyyz} & \sigma^2_{xzyz} & \sigma^2_{yzyz} \end{pmatrix} \quad (4)$$

It is well known in the theory of multivariate statistical analysis that any linear combination of a multivariate Gaussian distributed variable, such as $\tilde{D}$, must be distributed according to a univariate Gaussian distribution (51). One linear combination of $\tilde{D}$ is:

$$\text{Trace}(D)=(1,1,1,0,0,0)(D_{xx}, D_{yy}, D_{zz}, D_{xy}, D_{xz}, D_{yz})^T = D_{xx}+D_{yy}+D_{zz}=3<D> \quad (5)$$

where <D> is the orientationally-averaged, rotationally invariant mean diffusivity (or mean ADC). Then, within a particular voxel or within a homogeneous ROI, Trace(D) is distributed according to:

$$p(\text{Trace}(D)) = \frac{1}{\sqrt{2\pi\sigma_T^2}} \exp\left(-\frac{(\text{Trace } D) - i n^2}{2\sigma_T^2}\right) \quad (6)$$

where $\mu$ is the population mean and $\sigma_T^2$ is the population variance. Above, $$\mu=(1,1,1,0,0,0)(\mu_{xx}, \mu_{yy}, \mu_{zz}, \mu_{xy}, \mu_{xz}, \mu_{yz})^T = \mu_{xx}+\mu_{yy}+\mu_{zz} \quad (7)$$

and $$\sigma_T^2=(1,1,1,0,0,0)\Sigma(1,1,1,0,0,0)^T = \sigma_{xxxx}^2+\sigma_{yyyy}^2+\sigma_{zzzz}^2+2\sigma_{xxyy}^2+2\sigma_{yyzz}^2+2\sigma_{xxzz}^2 \quad (8)$$

where $$\sigma_{xxxx}^2=Var(D_{xx}), \sigma_{yyyy}^2=Var(D_{yy}), \sigma_{zzzz}^2=Var(D_{zz}), \quad (9)$$

and $$\sigma_{xxyy}^2=Cov(D_{xx}, D_{yy}), \sigma_{yyzz}^2=Cov(D_{yy}, D_{zz}), \sigma_{xxzz}^2=Cov(D_{xx}, D_{zz}) \quad (10)$$

It can be seen that the population mean of Trace(D) is the sum of the population means of the three diagonal elements of D. The population variance of Trace(D), however, is the sum of the variances of the diagonal elements of the diffusion tensor, $D_{xx}$, $D_{yy}$, and $D_{zz}$, (e.g., $Var(D_{xx})$), and of their covariances (e.g., $Cov(D_{xx}, D_{yy})$). In general, while the variances are all positive, the covariances can be either sign, and can contribute to the total variance, $\sigma_T^2$, of Trace(D) positively or negatively. Moreover, there is no a priori reason why these covariance terms should vanish, and even the earliest experiments on phantoms have shown that these terms generally are non-zero (17).

Typically, the population values are $\mu$, $\sigma_T^2$, and $\Sigma$ are unknown a priori. Hence, the population values must be estimated from experimental data, which can be performed in two manners. First D is estimated in each voxel using multivariate linear regression on a complete set of DWIs, from which sample estimates of $\mu$, $\sigma_T^2$, and $\Sigma$ (17) are obtained, or these estimates are obtained. Second, D is estimated in each voxel using the bootstrap method, in which a subset of the original data set is repeatedly sampled with replacement, as described in previous sections, and the moments of the diffusion tensor elements and functions of them, such as Trace(D), are empirically determined.

Since the distribution of Trace(D) is known, the hypotheses about its moments within individual voxels or within ROIs can be formulated and tested quantitatively (e.g., see (51)) for the first time with the invention. Specifically, clinical or biological relevant hypotheses, such as whether the Trace(D) is uniform in normal brain parenchyma, or whether the Trace(D) drops or is elevated in diseased areas of brain parenchyma, can be tested.

There are several tests that can be applied to establish whether Trace(D) is uniform within an ROI. For example, the following tests can be performed: whether the distribution of Trace(D) is described by a distribution with a single mean for the given level of background noise; whether the distribution of Trace(D) is described by a distribution with a single variance for the given level of background noise; whether the distribution of Trace(D) is described by a normal distribution for a given level of background noise; using a t-test for testing null hypothesis of a single mean of Trace(D); using an F-test for testing null hypothesis of a single variance of Trace(D); and using a Kolmogorov-Smirnov test for testing normal distribution of Trace(D).

To assess the difference in Trace(D) between two different ROIs, the hypothesis can be tested whether the mean of the Trace is different and whether the variance of the Trace is different in the two ROIs. If either is different, it can be concluded there is a significant difference between them. Prior to the invention, the variance of the Trace has never been examined, and may now provide valuable physiological information using the invention.

Figure 13:
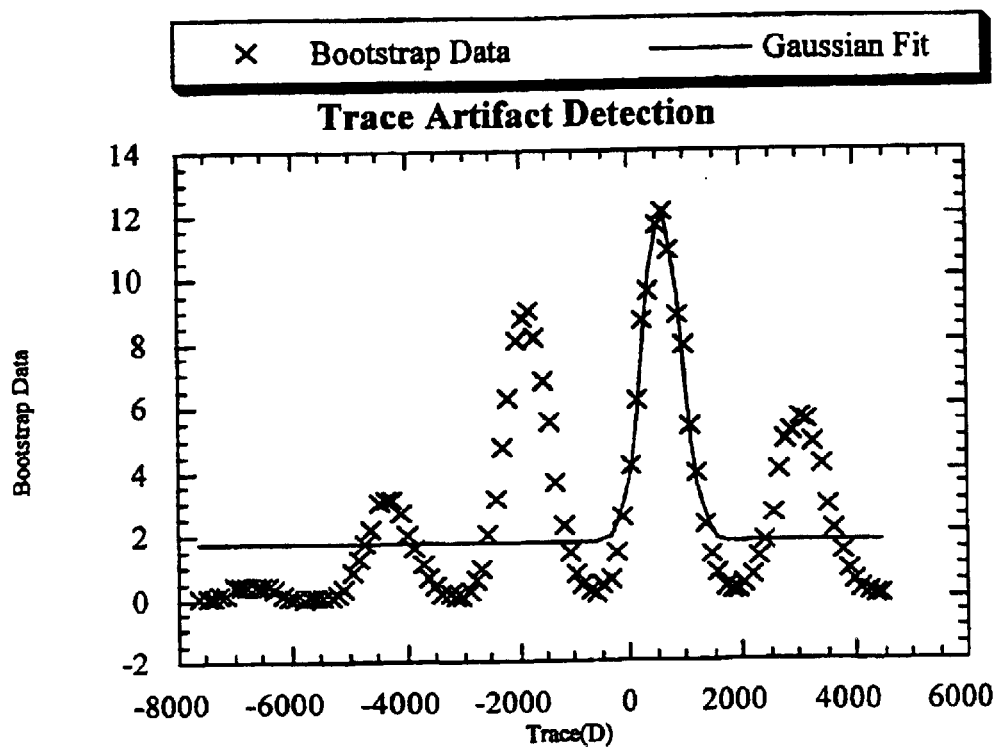
FIG. 13 illustrates the detection of artifacts in a diffusion weighted images.

Finally, to assess if Trace(D) is normally distributed within an ROI. Kolmogorov-Smirnov or Kuiper tests (52) can be used. Since, from basic principles, it is known that without systematic artifacts (e.g., due to patient motion) Trace(D) is normally distributed, within each voxel, and if Trace(D) is not normally distributed, the data has been corrupted by a systematic artifact. For example, FIG. 13 illustrates the detection of artifacts in diffusion weighted images. In FIG. 13, the distribution of Trace(D) obtained via the bootstrap method is not described by a Gaussian probability density function.

The test of Trace(D) can be preformed on a voxel-by-voxel basis. The test is accomplished by using the bootstrap method, which is a resampling technique, where an empirical distribution of diffusion tensor values is obtained in each voxel from a single set of diffusion weighted images. This method, and its applications to DT-MRI, are described in the previous sections.

If it is desired to make no a priori assignments of tissue within a particular ROI, and if it is desired to segment such a tissue region based upon the values of Trace(D), an iterative scheme to determine the region can be used in which Trace(D) is uniform, (i.e. Trace(D) is consistent with being drawn from a Gaussian distribution with the same mean and variance).

As discussed above, the Trace(D) and other quantities are determined based on a determination of the diffusion tensor from, preferably, seven or more diffusion weighted images. As an option, these quantities, such as Trace(D), can be approximated using fewer diffusion weighted images, such as five, four, two or one diffusion weighted images. A number of methods have been reported recently to obtain estimates of Trace(D) without directly computing the entire diffusion tensor. For example, estimates of Trace(D) can be obtained by summing four tetrahedrally encoded diffusion weighted images, each of which is normalized by one non-diffusion weighted image. This approach was proposed in (63) and (64). An estimate of Trace(D) can also be obtained by summing three apparent diffusion coefficients obtained from three diffusion weighted images whose diffusion gradients are applied along three orthogonal directions. An example of this approach is given in (53). In both cases above, these quantities are only an approximation to Trace(D) unless all cross-terms can be eliminated in the diffusion weighted imaging sequences, and each of the diffusion weighted images has the same value of Trace($\underline{b}$). Other schemes have been proposed to obtain "isotropically weighted" or Trace-weighted images with even fewer diffusion weighted images. In fact, several groups have proposed using only two diffusion weighted images to obtain an estimate of Trace(D). This is accomplished by acquiring one diffusion weighted image with no diffusion weighting and another that is "isotropically" weighted. Examples of this approach are given in (65), (66), and (67). To date, the statistical distribution, bias in the mean, variance, and other features of these estimates of Trace(D) using any of these proposed methods above have not been investigated.

6.3. Results and Discussion

Phantom studies were undertaken to determine empirically whether Trace(D) is Gaussian distributed in a homogeneous, isotropic phantom. A water phantom is used in this case containing 0.5% polyacrylic acid (500,000 MW) by volume. The long chain polymer present in such a low concentration does not affect water diffusivity of the bulk solution but does suppress a number of potential experimental artifacts that could be mistaken for water diffusion, such as mechanical vibrations (shear and bulk modes) and convection, owing to thermal gradients that may arise in the phantom. A thermal blanket was also used to ensure temperature uniformity throughout the phantom to within 0.1° C. This further reduces the possibility of Rayleigh convection arising in this sample, and limits the thermal variation in the diffusion coefficient in the sample, which is approximately 1.5% per 1° C. (61).

The MRI system was precalibrated to ensure that correct gradient scale factors were applied when obtaining DWIs, using a method similar to one outlined previously (18). Other artifacts, such as eddy currents effects were also mitigated by using well established approaches (see (21)). Susceptibility artifacts are only present near the walls of the container, so the regions of interest are always chosen far from them. The b-matrix for each DWI acquisition is numerically calculated (13), (12), (3) using software and a computer. Diffusion tensors are estimated using the method outlined in (17) using the measured intensities of the DWIs and their corresponding calculated b-matrices using multivariate linear regression.

The described embodiments, as well as the examples discussed herein, are non-limiting examples.

The invention has been described in detail with respect to preferred embodiments, and it will new be apparent from the foregoing to those skilled in the art that changes and modifications may be made without department from the invention in its broader aspects, and the invention, therefore, as defined in the claims is intended to cover all such changes and modifications as fall within the true spirit of the invention.

What is claimed is:

1. A computer-readable medium embodying software to control a computer system to perform a method for analyzing diffusion tensor magnetic resonance signals, comprising the steps of:

acquiring a plurality of diffusion weighted signals, each signal having a plurality of voxels;

sampling the diffusion weighted signals to obtain resampled diffusion weighted signals;

determining a diffusion tensor for each voxel from the resampled diffusion weighted signals using statistical estimation; and determining an empirical statistical distribution for a quantity associated with the diffusion tensor from the diffusion tensors determined from the resampled diffusion weighted signals.

2. A computer-readable medium as in claim 1, wherein the empirical statistical distribution is one of a probability density function, a cumulative density function, or a histogram.

3. A computer-readable medium as in claim 1, wherein the quantity associated with the diffusion tensor is one of an element of the diffusion tensor, a linear combination of the elements of the diffusion tensor, or a function of the diffusion tensor.

4. A computer-readable medium as in claim 3, wherein the linear combination of the elements of the diffusion tensor is the Trace of the diffusion tensor.

5. A computer-readable medium as in claim 3, wherein the function of the diffusion tensor is one of a principal diffusivity, a rotationally invariant measure, a relative anisotropy, a diffusion tensor deviatoric, or an eigenvector.

6. A computer-readable medium as in claim 1, further comprising the step of diagnosing a subject based on features of the empirical statistical distribution for the quantity.

7. A computer-readable medium as in claim 6, wherein the empirical statistical distribution is one of a probability density function or a cumulative density function, and the features of the empirical statistical distribution are the first and higher moments of the empirical statistical distribution.

8. A computer-readable medium as in claim 1, further comprising the step of segmenting, clustering, or classifying a portion of a subject based on features of the empirical statistical distribution for the quantity.

9. A computer-readable medium as in claim 1, further comprising the step of identifying systematic artifacts in the diffusion weighted signals of the subject based on features of the empirical statistical distribution for the quantity.

10. A computer-readable medium as in claim 1, wherein the diffusion weighted signals are diffusion weighted images.

11. A computer-readable medium as in claim 1, wherein the diffusion weighted signals are based on a subject, and the subject is one of a living creature or a non-living object.

12. A computer-readable medium as in claim 1, wherein the step of sampling is performed a plurality of times.

13. A computer-readable medium as in claim 1, further comprising the steps of:

determining a parametric statistical distribution for the quantity associated with the diffusion tensor; and comparing the empirical statistical distribution for the quantity and the parametric statistical distribution for the quantity.

14. A computer-readable medium as in claim 13, wherein the parametric statistical distribution is a multivariate Gaussian distribution.

15. A computer-readable medium as in claim 13, wherein the parametric statistical distribution is a univariate Gaussian distribution.

16. A computer-readable medium as in claim 1, wherein the diffusion tensor is determined for at least one region of interest.

17. A computer-readable medium embodying software to control a computer system to perform a method for analyzing diffusion tensor magnetic resonance signals, comprising the steps of:

performing the method of claim 1 for a first time point; and performing the method of claim 1 for a second time point.

18. A computer-readable medium as in claim 1, wherein the statistical estimation comprises multivariate regression.

19. A computer-readable medium as in claim 1, further comprising identifying fiber tracts in a subject based on features of the empirical statistical distribution for the quantity.

20. A method for analyzing diffusion tensor magnetic resonance signals, comprising the steps of:

acquiring a plurality of diffusion weighted signals, each signal having a plurality of voxels;

sampling the diffusion weighted signals to obtain resampled diffusion weighted signals;

determining a diffusion tensor for each voxel from the resampled diffusion weighted signals using statistical estimation; and determining an empirical statistical distribution for a quantity associated with the diffusion tensor from the diffusion tensors determined from the resampled diffusion weighted signals.

21. An apparatus for analyzing diffusion tensor magnetic resonance signals, comprising:

means for acquiring a plurality of diffusion weighted signals, each signal having a plurality of voxels;

means for sampling the diffusion weighted signals to obtain resampled diffusion weighted signals;

means for determining a diffusion tensor for each voxel from the resampled diffusion weighted signals using statistical estimation; and means for determining an empirical statistical distribution for a quantity associated with the diffusion tensor from the diffusion tensors determined from the resampled diffusion weighted signals.

22. A computer-readable medium embodying software to control a computer system to perform a method for analyzing diffusion tensor magnetic resonance signals, comprising the steps of:

acquiring a plurality of diffusion weighted signals, each signal having a plurality of voxels;

sampling the diffusion weighted signals to obtain resampled diffusion weighted signals;

identifying at least two regions of interest in the diffusion weighted signals, each region of interest comprising at least one voxel;

determining a diffusion tensor for each voxel in each region of interest from the resampled diffusion weighted signals using statistical estimation; and determining an empirical statistical distribution for a quantity associated with the diffusion tensor from the diffusion tensors for each voxel in each region of interest.

23. A computer-readable medium as in claim 22, further comprising the step of comparing the empirical statistical distributions for the quantity across the regions of interest to obtain differences in features of the empirical statistical distributions for the quantity between the regions of interest.

24. A computer-readable medium as in claim 23, wherein the differences in the features of the empirical statistical distributions for the quantity are determined by performing hypothesis tests on the differences in the features of the empirical statistical distributions for the quantity between the regions of interest.

25. A computer-readable medium as in claim 22, wherein the statistical estimation comprises multivariate regression.

26. A computer readable medium as in claim 22, further comprising identifying fiber tracts in a subject base on features of the empirical statistical distribution for the quantity.

27. A method for analyzing diffusion tensor magnetic resonance signals, comprising the steps of:
acquiring a plurality of diffusion weighted signals, each signal having a plurality of voxels;
sampling the diffusion weighted signals to obtain resampled diffusion weighted signals;
identifying at feast two regions of interest in the diffusion weighted signals, each region of interest comprising at least one voxel;
determining a diffusion tensor for each voxel in each region of interest from the resampled diffusion weighted signals using statistical estimation; and
determining an empirical statistical distribution for a quantity associated with the diffusion tensor from the diffusion tensors for each voxel in each region of interest.

28. An apparatus for analyzing diffusion tensor magnetic resonance signals, comprising:
means for acquiring a plurality of diffusion weighted signals, each signal having a plurality of voxels;
means for sampling the diffusion weighted signals to obtain resampled diffusion weighted signals;
means for identifying at least two regions of interest in the diffusion weighted signals, each region of interest comprising at least one voxel;
means for determining a diffusion tensor for each voxel in each region of interest from the resampled diffusion weighted signals using statistical estimation; and
means for determining an empirical statistical distribution for a quantity associated with the diffusion tensor from the diffusion tensors for each voxel in each region of interest.

29. A computer-readable medium embodying software to control a computer system to perform a method for analyzing diffusion tensor magnetic resonance signals, comprising the steps of:
acquiring a plurality of diffusion weighted signals for a first time point, each signal having a plurality of voxels;
sampling the diffusion weighted signals for the first time point to obtain resampled diffusion weighted signals for the first time point;
identifying a region of interest in the diffusion weighted signals for the first time point, the region of interest comprising at least one voxel;
determining a diffusion tensor for each voxel in the region of interest for the first time point from the resampled diffusion weighted signals for the first time point using statistical estimation;
determining an empirical statistical distribution for a quantity associated with the diffusion tensor from the diffusion tensors for each voxel in the region of interest for the first time point;
acquiring a plurality of diffusion weighted signals for a second time point, each signal having a plurality of voxels;
sampling the diffusion weighted signals for the second time point to obtain resampled diffusion weighted signals for the second time point;
identifying a region of interest in the diffusion weighted signals for the second time point, the region of interest comprising at least one voxel;
determining a diffusion tensor for each voxel in the region of interest for the second time point from the resampled diffusion weighted signals for the second time point using statistical estimation; and
determining an empirical distribution for a quantity associated with the diffusion tensor from the diffusion tensors for each voxel in the region of interest for the second time point.

30. A computer-readable medium as in claim 29, further comprising the step of comparing features of the empirical statistical distribution for the quantity for the region of interest for the first time point and features of the empirical statistical distribution for the quantity for the region of interest for the second time point.

31. A computer-readable medium as in claim 29, wherein the statistical estimation comprises multivariate regression.

32. A computer readable medium as in claim 29, further comprising identifying fiber tracts in a subject base on features of the empirical statistical distribution for the quantity.

33. A method for analyzing diffusion tensor magnetic resonance signals, comprising the steps of:
acquiring a plurality of diffusion weighted signals for a first time point, each signal having a plurality of voxels;
sampling the diffusion weighted signals for the first time point to obtain resampled diffusion weighted signals for the first time point;
identifying a region of interest in the diffusion weighted signals for the first time point, the region of interest comprising at least one voxel;
determining a diffusion tensor for each voxel in the region of interest for the first time point from the resampled diffusion weighted signals for the first time point using statistical estimation;
determining an empirical statistical distribution for a quantity associated with the diffusion tensor from the diffusion tensors for each voxel in the region of interest for the first time point;
acquiring a plurality of diffusion weighted signals for a second time point, each signal having a plurality of voxels;
sampling the diffusion weighted signals for the second time point to obtain resampled diffusion weighted signals for the second time point;
identifying a region of interest in the diffusion weighted signals for the second time point, the region of interest comprising at least one voxel;
determining a diffusion tensor for each voxel in the region of interest for the second time point from the resampled diffusion weighted signals for the second time point using statistical estimation; and
determining an empirical distribution for a quantity associated with the diffusion tensor from the diffusion tensors for each voxel in the region of interest for the second time point.

34. An apparatus for analyzing diffusion tensor magnetic resonance signals, comprising:
means for acquiring a plurality of diffusion weighted signals for a first time point, each signal having a plurality of voxels;
means for sampling the diffusion weighted signals for the first time point to obtain resampled diffusion weighted signals for the first time point;
means for identifying a region of interest in the diffusion weighted signals for the first time point, the region of interest comprising at least one voxel;

means for determining a diffusion tensor for each voxel in the region of interest for the first time point from the resampled diffusion weighted signals for the first time point using statistical estimation;

means for determining an empirical statistical distribution for a quantity associated with the diffusion tensor from the diffusion tensors for each voxel in the region of interest for the first time point;

means for acquiring a plurality of diffusion weighted signals for a second time point, each signal having a plurality of voxels;

means for sampling the diffusion weighted signals for the second time point to obtain resampled diffusion weighted signals for the second time point;

means for identifying a region of interest in the diffusion weighted signals for the second time point, the region of interest comprising at least one voxel;

means for determining a diffusion tensor for each voxel in the region of interest for the second time point from the resampled diffusion weighted signals for the second time point using statistical estimation; and means for determining an empirical distribution for a quantity associated with the diffusion tensor from the diffusion tensors for each voxel in the region of interest for the second time point.

35. A computer-readable medium embodying software to control a computer system to perform a method for analyzing diffusion tensor magnetic resonance signals, comprising the steps of:

acquiring at least one diffusion weighted signal, each signal having a plurality of voxels;

sampling each diffusion weighted signal to obtain respective resampled diffusion weighted signals;

approximating a quantity associated with a diffusion tensor for each voxel from the resampled diffusion weighted signals based on a statistical estimation of the diffusion tensor; and determining an empirical statistical distribution for the quantity associated with the diffusion tensor from the quantity associated with the diffusion tensor.

36. A computer-readable medium as in claim 35, wherein the quantity associated with the diffusion tensor is an approximation of a Trace of the diffusion tensor.

37. A computer-readable medium as in claim 35, wherein the quantity associated with the diffusion sensor is one of a principal diffusivity, a rotationally invariant measure, a relative anisotropy, a diffusion tensor deviatoric, or an eigenvector.

38. A computer-readable medium as in claim 35, further comprising the step of diagnosing a subject based on features of the empirical statistical distribution for the quantity.

39. A computer-readable medium as in claim 35, wherein the statistical estimation comprises multivariate regression.

40. A computer readable medium as in claim 38, further comprising identifying fiber tracts in a subject base on features of the empirical statistical distribution for the quantity.

41. A computer readable medium as in claim 38, wherein the quantity associated with the diffusion tensor is approximated without determining the diffusion tensor.

42. A computer readable medium as in claim 38, wherein the diffusion weighted signals are diffusion weighted images, wherein the quantity associated with the diffusion tensor is approximated with less than seven diffusion weighted images.

43. A method for analyzing diffusion tensor magnetic resonance signals, comprising the steps of: acquiring at least one diffusion weighted signal, each signal having a plurality of voxels;

sampling each diffusion weighted signal to obtain respective resampled diffusion weighted signals;

approximating a quantity associated with a diffusion tensor for each voxel from the resampled diffusion weighted signals based on a statistical estimation of the diffusion tensor; and determining an empirical statistical distribution for the quantity associated with the diffusion tensor from the quantity associated with the diffusion tensor.

44. An apparatus for analyzing diffusion tensor magnetic resonance signals, comprising:

means for acquiring at least one diffusion weighted signal, each signal having a plurality of voxels;

means for sampling each diffusion weighted signal to obtain respective resampled diffusion weighted signals;

means for approximating a quantity associated with a diffusion tensor for each voxel from the resampled diffusion weighted signals based on a statistical estimation of the diffusion tensor; and means for determining an empirical statistical distribution for the quantity associated with the diffusion tensor from the quantity associated with the diffusion tensor.

* * * * *

UNITED STATES PATENT AND TRADEMARK OFFICE
CERTIFICATE OF CORRECTION

| | | |
|---|---|---|
| PATENT NO. | : 6,845,342 B1 | Page 1 of 1 |
| APPLICATION NO. | : 09/979013 | |
| DATED | : January 18, 2005 | |
| INVENTOR(S) | : Peter J. Basser et al. | |

It is certified that error appears in the above-identified patent and that said Letters Patent is hereby corrected as shown below:

Column 30, line 6, claim 40 should read as "A computer readable medium as in claim 35."

Column 30, line 10, claim 41 should read as "A computer readable medium as in claim 35."

Column 30, line 13, claim 42 should read as "A computer readable medium as in claim 35."

Signed and Sealed this

Tenth Day of February, 2009

JOHN DOLL
*Acting Director of the United States Patent and Trademark Office*